(12) United States Patent
Fujita et al.

(10) Patent No.: US 7,507,518 B2
(45) Date of Patent: Mar. 24, 2009

(54) PHOTOSENSITIVE RESIN PRECURSOR COMPOSITION

(75) Inventors: Yoji Fujita, Shiga (JP); Tomoyuki Yuba, Kyoto (JP); Mitsuhito Suwa, Shiga (JP)

(73) Assignee: Toray Industries, Inc., Tokyo (JP)

( * ) Notice: Subject to any disclaimer, the term of this patent is extended or adjusted under 35 U.S.C. 154(b) by 158 days.

(21) Appl. No.: 10/885,100

(22) Filed: Jul. 7, 2004

(65) Prior Publication Data
US 2005/0014876 A1 Jan. 20, 2005

(30) Foreign Application Priority Data
Jul. 9, 2003 (JP) .............................. 2003-194160

(51) Int. Cl.
G03F 7/021 (2006.01)
G03F 7/023 (2006.01)
G03F 7/30 (2006.01)

(52) U.S. Cl. ...................... 430/157; 430/165; 430/176; 430/191; 430/192; 430/193; 430/270.1; 430/325; 430/326

(58) Field of Classification Search ................. 430/191, 430/192, 193, 157, 176, 270.1, 165, 326, 430/325
See application file for complete search history.

(56) References Cited

U.S. PATENT DOCUMENTS

| | | | | |
|---|---|---|---|---|
| 4,161,477 A | * | 7/1979 | Long et al. ................... | 548/461 |
| 4,778,727 A | * | 10/1988 | Tesoro et al. ................. | 428/448 |
| 6,329,110 B1 | | 12/2001 | Nunomura et al. | |
| 6,436,593 B1 | * | 8/2002 | Minegishi et al. ............. | 430/18 |
| 6,524,764 B1 | * | 2/2003 | Tomikawa et al. ........... | 430/191 |
| 6,593,043 B2 | * | 7/2003 | Suwa et al. ................... | 430/18 |
| 6,600,006 B2 | | 7/2003 | Jung et al. | |
| 6,929,891 B2 | * | 8/2005 | Rushkin et al. ............... | 430/18 |
| 6,933,087 B2 | * | 8/2005 | Suwa et al. .................... | 430/7 |
| 2002/0086934 A1 | * | 7/2002 | Kawaguchi et al. .......... | 524/544 |
| 2006/0110680 A1 | * | 5/2006 | Taniguchi et al. ......... | 430/270.1 |

FOREIGN PATENT DOCUMENTS

| | | |
|---|---|---|
| JP | 2001-042527 A | 2/2001 |
| JP | 2001-312051 A | 11/2001 |
| JP | 2002-122993 A | 4/2002 |
| JP | 2002-169283 A | 6/2002 |
| JP | 2002-328472 A | 11/2002 |
| JP | 2003-121998 A | 4/2003 |
| WO | WO 02/069041 | * 9/2002 |

OTHER PUBLICATIONS

European Search Report mailed on Aug. 18, 2006, for European patent application No. 04016008.7, filed on Jul. 7, 2004, 2 pages.

* cited by examiner

*Primary Examiner*—John S Chu
(74) *Attorney, Agent, or Firm*—Darby & Darby, P.C.

(57) ABSTRACT

The present invention relates to a positive photosensitive resin precursor composition which exhibits good storage stability after exposure.

A photosensitive resin precursor composition comprises (a) a polymer essentially composed of a structural unit expressed by formula (1); (b) at least two photo acid generators; and (c) a compound having an alkoxymethyl group:

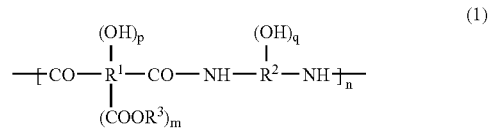

wherein $R^1$ represents an organic group with a valence of 2 to 8, having at least two carbon atoms; $R^2$ represents an organic group with a valence of 2 to 6, having at least two carbon atoms; $R^3$ represents hydrogen or an organic group having a carbon number in the range of 1 to 20; n represents a number ranging from 10 to 100,000; m represents an integer in the range of 0 to 2; and p and q represent integers in the range of 0 to 4 and satisfy $p+q>0$.

4 Claims, No Drawings

PHOTOSENSITIVE RESIN PRECURSOR COMPOSITION

BACKGROUND OF THE INVENTION

1. Field of the Invention

The present invention relates to a positive photosensitive resin precursor composition suitably used for a surface protection layer and an insulating interlayer of a semiconductor element, an insulating layer of an organic electroluminescent device, and the like, and which becomes soluble in alkaline developers by being exposed to UV light.

2. Description of the Related Art

Known positive heat-resistant resin precursor compositions, whose exposed area is dissolved by development, may contain a polyamic acid and a quinone diazide; a soluble polyimide having a hydroxy group and a quinone diazide; or a polyamide having a hydroxy group and a quinone diazide.

Unfortunately, a typical positive heat-resistant resin precursor composition containing polyamic acid and quinone diazide hardly provides desired patterns because the carboxyl group of the polyamic acid has a solubility higher than the dissolution inhibition of the quinone diazide, in alkali. Although the positive heat-resistant resin precursor composition containing soluble polyimide whose principal chain has a hydroxy group reduces such a problem, the structure is disadvantageously limited to ensure solubility, and consequently the resulting polyimide resin is less solvent-resistant. The composition containing polyamide having a hydroxy group and quinone diazide is also limited in structure to ensure solubility. Consequently, the resulting resin, which is obtained by heat treatment, is undesirably less solvent-resistant.

In order to control the alkali solubility of the polyamic acid, a polyamic acid derivative has been developed whose carboxyl group is protected with an ester group. Compositions containing the polyamic acid derivative and naphthoquinone diazide extremely increase the dissolution inhibition of the naphthoquinone diazide in alkali. Consequently, while the compositions can provide desired patterns, the photosensitivity is largely degraded in most cases.

Some compositions providing an increased photosensitivity have recently been disclosed. For example, Japanese Unexamined Patent Application Publication No. 2002-328472 teaches a composition containing a polyamic ester and/or a polyamic polymer and a thermally cross-likable compound having a phenolic hydroxy group; Japanese Unexamined Patent Application Publication No. 2001-42527 and U.S. Pat. No. 6,329,110, a composition containing a polyamic ester and an iodonium salt as a dissolution inhibitor; Japanese Unexamined Patent Application Publication No. 2002-169283, a composition containing a polyamide and a iodonium salt as the dissolution inhibitor; Japanese Unexamined Patent Application Publication No. 2002-122993, a composition containing a polyamic ester, a photo acid generator, and a compound having a vinyloxy group; and U.S. Pat. No. 6,600,006, a composition containing a polyamic ester having an acid degradable group and a photo acid generator. These compositions provide desired photosensitivity as long as they are developed immediately after exposure. However, if the compositions are allowed to stand for a time interval of several hours to several days between exposure and development, the photosensitivity is extremely degraded.

In use of the heat-resistant resin precursor composition for semiconductor devices, the resulting cured resin by heating remains in the device as a permanent coating. Accordingly, the adhesion between the cured coating and the substrate is very important. However, the composition does not provide an adequate adhesion to the substrate, and accordingly it is unsuitable for practical use.

Hence, the above-described known compositions for enhancing the photosensitivity result in a degraded photosensitivity if they are allowed to stand for a time interval of several hours to several days between exposure and development, or do not ensure adequate adhesion to the substrate if they are applied to semiconductor devices, disadvantageously.

SUMMARY OF THE INVENTION

Accordingly, an object of the present invention is to provide a photosensitive resin precursor composition which maintains the photosensitivity, exhibits good storage stability after exposure, and ensures the adhesion to the substrate.

According to an aspect of the present invention, a photosensitive resin precursor composition is provided which contains: (a) a polymer essentially composed of a structural unit expressed by formula (1); (b) at least two photo acid generators; and (c) a compound having an alkoxymethyl group:

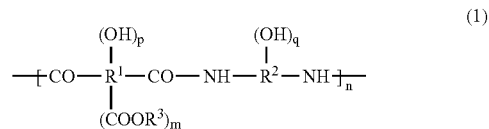

$R^1$ represents an organic group with a valence of 2 to 8, having at least two carbon atoms; $R^2$ represents an organic group with a valence of 2 to 6, having at least two carbon atoms; and $R^3$ represents hydrogen or an organic group having a carbon number in the range of 1 to 20. n represents a number of ranging from 10 to 100,000; m represents an integer in the range of 0 to 2; and p and q represent integers in the range of 0 to 4 and satisfy the relationship $p+q>0$.

The present invention achieves an alkali solution-soluble positive photosensitive resin precursor composition which not only has superior resolution and photosensitivity, but also exhibits superior storage stability after exposure and good adhesion to the substrate.

DESCRIPTION OF THE PREFERRED EMBODIMENTS

Constituent (a) or the polymer essentially composed of the structural unit expressed by formula (1) can be formed into a polymer having an imide ring, an oxazole ring, or other ring structures by heating or an appropriate catalyst. Preferred examples of the polymer include polyimide precursors, such as polyamic acid and polyamic ester, and polybenzoxazole precursors, such as polyhydroxyamide. Such a ring structure dramatically increases the heat resistance and organic solvent resistance of the resulting resin.

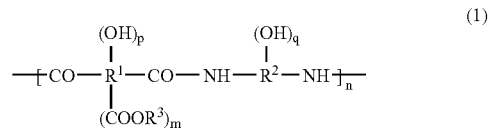

In formula (1), $R^1$ represents an organic group with a valence of 2 to 8 having at least two carbon atoms, and is a structural component of an acid. Exemplary divalent organic groups include aromatic dicarboxylic acids, such as terephthalic acid, isophthalic acid, diphenyletherdicarboxylic acid, naphthalenedicarboxylic acid, and bis(carboxyphenyl)propane; and aliphatic dicarboxylic acids, such as cyclohexanedicarboxylic acid and adipic acid. Trivalent organic groups include tricarboxylic acids such as trimellitic acid and trimesic acid; tetravalent organic groups include tetracarboxylic acids such as pyromellitic acid, benzophenonetetracarboxylic acid, biphenyltetracarboxylic acid, and diphenylethertetracarboxylic acid. In addition, other acids having a hydroxy group may be used, such as hydroxyphthalic acid and hydroxytrimellitic acid. These acid components may be used singly or in combination, but, preferably, 1 to 40 molar percent of tetracarboxylic acid is copolymerized.

Preferably, the tetracarboxylic acid has an aromatic ring and an organic group with a valence of 3 to 8 having 1 to 4 hydroxy groups and at least two carbon atoms. More preferably, the organic group is trivalent or tetravalent and has a carbon number in the range of 6 to 30. Specifically, $R^1(COOR^3)_m(OH)_p$ in formula (1) is preferably expressed by formula (5):

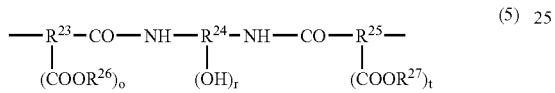

$R^{23}$ and $R^{25}$ may be the same or different and each represent an organic group with a valence of 2 to 4 having a carbon number in the range of 2 to 20; $R^{24}$ represents an organic group with a valence of 3 to 6 and a carbon number in the range of 3 to 20, having an hydroxy group; $R^{26}$ and $R^{27}$ may be the same or different and each represent hydrogen or an organic group having a carbon number in the range of 1 to 20. o and t each represent an integer in the range of 0 to 2, and r represents an integer in the range of 1 to 4.

More preferably, such a structure contains an aromatic ring, and particularly preferably a residue of trimellitic acid, trimesic acid, or naphthalenetricarboxylic acid, from the viewpoint of heat resistance of the resulting polymer. $R^{24}$ is an organic group with a valence of 3 to 6 and a carbon number in the range of 3 to 20, having a hydroxy group. Preferably, the hydroxy group is adjacent to an amide bond. Examples of such a structure include fluorine-containing bis(3-amino-4-hydroxyphenyl)hexafluoropropane and bis(3-hydroxy-4-aminophenyl)hexafluoropropane, and fluorine-free bis(3-amino-4-hydroxyphenyl)propane, bis(3-hydroxy-4-aminophenyl)propane, 3,3'-diamino-4,4'-dihydroxybiphenyl, 3,3'-dihydroxy-4,4'-diaminobiphenyl, 2,4-diaminophenol, 2,5-diaminophenol, and 1,4-diamino-2,5-dihydroxybenzene whose amino groups are boned.

$R^{26}$ and $R^{27}$ may be the same or different, and each represent hydrogen or an organic group having a carbon number in the range of 1 to 20. A carbon number of more than 20 leads to a reduced solubilities in alkaline developers. o and t are each an integer of 0 to 2, and preferably 1 or 2. r represents an integer in the range of 1 to 4. A variable r of 5 or more negatively affects characteristics of the resulting heat resistant resin film.

The compounds expressed by formula (5) preferably have, but not limited to, the following structures:

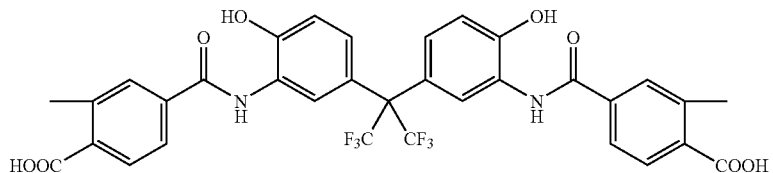

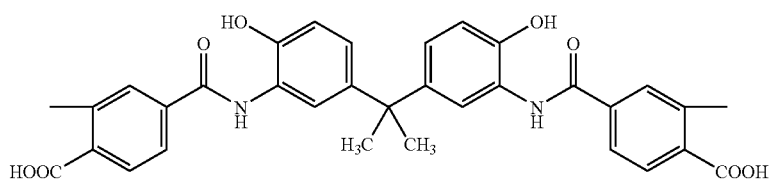

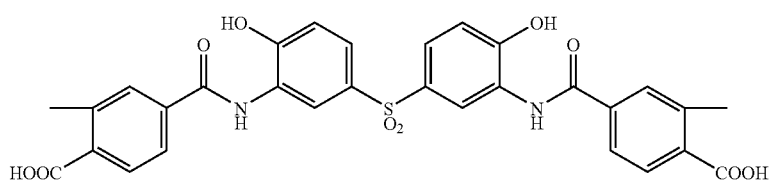

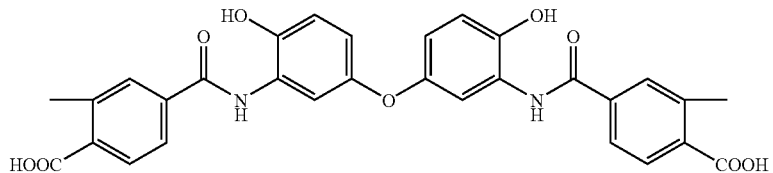

-continued

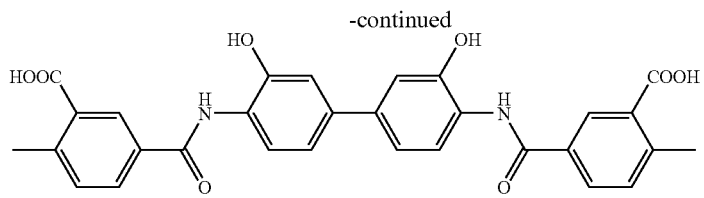

These compounds may be modified with a tetracarboxylic acid or dicarboxylic acid having no hydroxy group unless the solubility in alkali, photosensitivity, and heat resistance are negatively affected. Such tetracarboxylic and dicarboxylic acids include: aromatic tetracarboxylic acids, such as pyromellitic acid, benzophenonetetracarboxylic acid, biphenyltetracarboxylic acid, diphenylethertetracarboxylic acid, and diphenylsulfonetetracarboxylic acid, and diester compounds in which two carboxyl groups of these aromatic carboxylic acids are replaced with the methyl or ethyl group; aliphatic tetracarboxylic acids, such as butanetetracarboxylic acid and cyclopentanetetracarboxylic acid, and diester compounds in which two carboxyl groups of these aliphatic carboxylic acids are replaced with the methyl or ethyl group; aromatic dicarboxylic acids, such as terephthalic acid, isophthalic acid, diphenyletherdicarboxylic acid, and naphthalenedicarboxylic acid; and aliphatic dicarboxylic acids, such as adipic acid. Preferably, the acid component in the structure is modified at a ratio of 50 molar percent or less, and more preferably at a ratio of 30 molar percent or less. Modification at a ratio of more than 50 molar percent is likely to negatively affect the solubility in alkali and photosensitivity.

$R^2$ in formula (1) represents an organic group with a valence of 2 to 6 and at leas two carbon atoms, and is a structural component of a diamine. Preferably, $R^2$ has an aromatic group and a hydroxy or carboxyl group, from the viewpoint of the heat resistance of the resulting polymer. Examples of such a structure include fluorine-containing bis (aminohydroxyphenyl)hexafluoropropane; and a fluorine-free diaminodihydroxypyrimidine, diaminodihydroxypyridine, hydroxydiaminopyrimidine, diaminophenol, dihydroxybenzidine, diaminobenzoic acid, diaminoterephthalic acid. Alternatively, $R^2(OH)_q$ in formula (1) may have a structure expressed by general formula (6), (7), or (8):

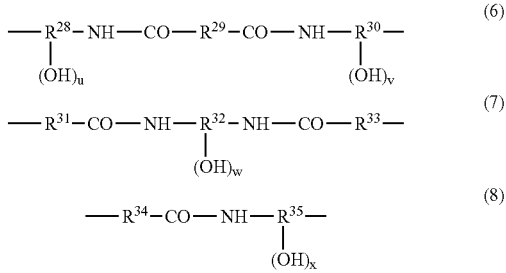

$R^{28}$ and $R^{30}$ in formula (6) may be the same or different, and each represent a trivalent or tetravalent organic group with a carbon number in the range of 2 to 20 having a hydroxy group, and $R^{29}$ represents a divalent organic group with a carbon number in the range of 2 to 30. u and v each represent an integer of 1 or 2. $R^{31}$ and $R^{33}$ in formula (7) may be the same or different, and each represent a divalent organic group with a carbon number in the range of 2 to 20, and $R^{32}$ represents an organic group with a valence of 3 to 6 and a carbon number in the range of 3 to 20 having a hydroxy group. w represents an integer in the range of 1 to 4. $R^{34}$ in formula (8) represents a divalent organic group with a carbon number in the range of 2 to 20, and $R^{35}$ represents an organic group with a valence of 3 to 6 and a carbon number in the range of 3 to 20 having a hydroxy group. x represents an integer in the range of 1 to 4.

In formula (6), $R^{28}$ and $R^{30}$ each represent a trivalent or tetravalent organic group with a carbon number in the range of 2 to 20, having a hydroxy group. Preferably, $R^{28}$ and $R^{30}$ have an aromatic ring from the viewpoint of the heat resistance of the resulting polymer. Specifically, examples of such groups include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl)propane, bis(hydroxyphenyl)sulfone, hydroxydiphenyl ether, and dihydroxydiphenyl ether. In addition, aliphatic groups may be used, such as hydroxycyclohexyl and dihydroxycyclohexyl. $R^{29}$ is a divalent organic group having a carbon number in the range of 2 to 30. Preferably, $R^{29}$ is a divalent group containing an aromatic ring, and may be phenyl, biphenyl, diphenyl ether, diphenylhexafluoropropane, diphenylpropane, or diphenylsulfone, from the viewpoint of the heat resistance of the resulting polymer. In addition, aliphatic groups such as cyclohexyl may be used.

In formula (7), $R^{31}$ and $R^{33}$ are each a divalent organic group having a carbon number of 2 to 20. Preferably, $R^{31}$ and $R^{33}$ are each a divalent group containing an aromatic ring, and may be phenyl, biphenyl, diphenyl ether, diphenylhexafluoropropane, diphenylpropane, or diphenylsulfone, from the viewpoint of the heat resistance of the resulting polymer. Alternatively, aliphatic groups such as cyclohexyl may be used. $R^{32}$ is an organic group with a valence of 3 to 6 and a carbon number in the range of 3 to 20 having a hydroxy group, and, preferably, has an aromatic ring from the viewpoint of the heat resistance of the resulting polymer. Specifically, examples of such a group include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl)propane, bis(hydroxyphenyl)sulfone, hydroxydiphenyl ether, and dihydroxydiphenyl ether. In addition, aliphatic groups may be used, such as hydroxycyclohexyl and dihydroxycyclohexyl.

$R^{34}$ in formula (8) is a divalent organic group having a carbon number in the range of 2 to 20. Preferably, $R^{34}$ is a divalent group containing an aromatic ring, and may be phenyl, biphenyl, diphenyl ether, diphenylhexafluoropropane, diphenylpropane, or diphenylsulfone, from the viewpoint of the heat resistance of the resulting polymer. In addition, aliphatic groups such as cyclohexyl may be used. $R^{35}$ is an organic group with a valence of 3 to 6 and a carbon number in the range of 3 to 20 having a hydroxy group, and, preferably, has an aromatic ring from the viewpoint of the heat resistance of the resulting polymer. Specifically, examples of such a group include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl)propane, bis(hydroxyphenyl)sulfone, hydroxydiphenyl ether, and dihydroxydiphenyl ether. In addition, aliphatic groups may be used, such as hydroxycyclohexyl and dihydroxycyclohexyl.

u and v in formula (6) each represent an integer of 1 or 2, and w in formula (7) and x in formula (8) each represent an integer in the range of 1 to 4.

The compounds expressed by formula (6) preferably have, but not limited to, the following structures:

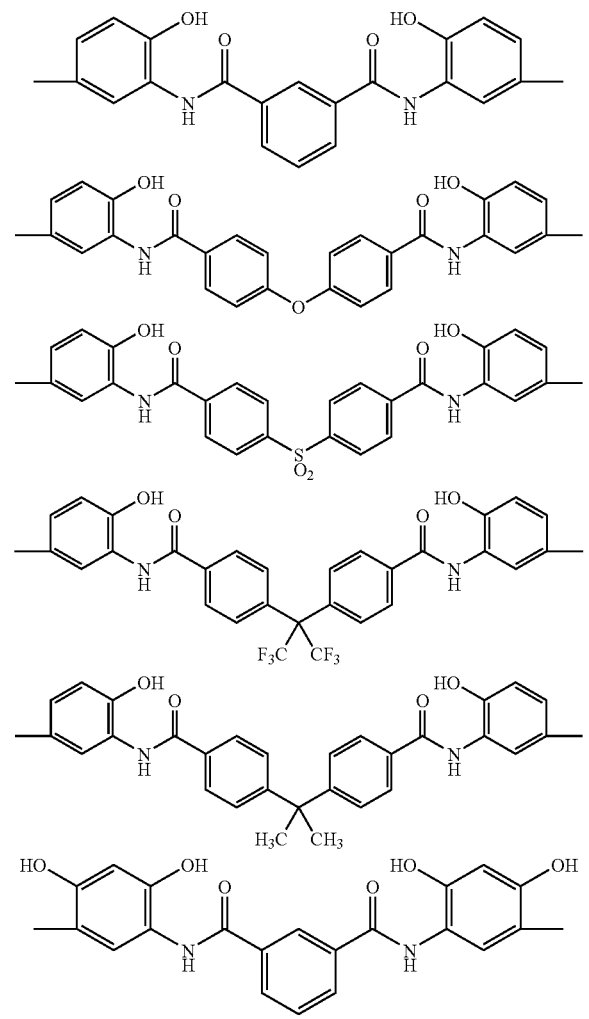

The compounds expressed by formula (7) preferably have, but not limited to, the following structures:

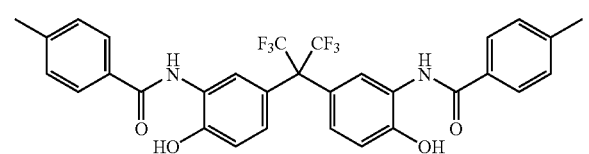

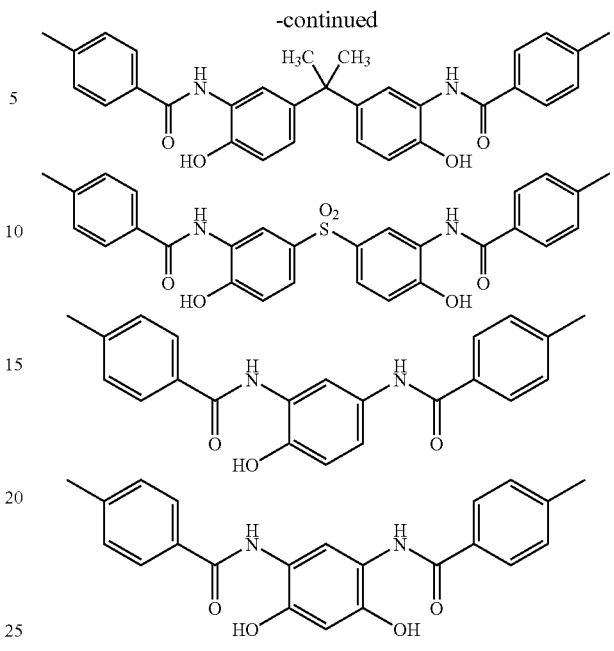

The compounds expressed by formula (8) preferably have, but not limited to, the following structures:

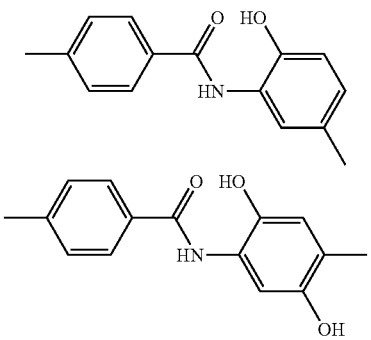

The diamines expressed by formulas (6), (7), and (8) may be modified with 1 to 40 molar percent of another diamine component. Such diamine components include phenylenediamine, diaminodiphenyl ether, aminophenoxybenzene, diaminodiphenylmethane, diaminodiphenylsulfone, bis(trifluoromethyl)benzidine, bis(aminophenoxyphenyl)propane, and bis(aminophenoxyphenyl)sulfone. Aromatic rings of these compounds may have a substituted alkyl group or halogen. In addition, aliphatic diamines may be used, such as cyclohexyldiamine, methylenebis(cyclohexylamine), and hexamethylenediamine. However, if 40 molar percent or more of such aliphatic diamine is copolymerized, the heat resistance of the resulting polymer is negatively affected.

$R^3$ in formula (1) represents hydrogen or an organic group having a carbon number in the range of 1 to 20. While $R^3$ is preferably an organic group (alkyl group) in view of the stability of photosensitive resin precursor solution, it is preferably hydrogen in view of the solubility in aqueous alkaline solution. In the present invention, hydrogen and an alkyl group can coexist. Since the dissolution rate in aqueous alkaline solution changes according to the proportion between hydrogen and the organic group in $R^3$, setting an appropriate proportion can achieve a photosensitive resin precursor composition exhibiting a suitable dissolution rate. Preferably, the proportion of hydrogen in $R^3$ is in the range of 10 to 90 percent. A carbon number of $R^3$ larger than 20 results in a polymer insoluble in aqueous alkaline solution. Accordingly, it is preferable that at least one of $R^3$ is a hydrocarbon group having a carbon number in the range of 1 to 16, and that the others are hydrogen atoms.

m in formula (1) represents the number of carboxyl groups, and is an integer of 0 to 2. Preferably, m is 1 or 2. p and q in formula (1) represent integers in the range of 0 to 4, and satisfy the relationship p+q>0. n in formula (1) represents the number of repeating units of the polymer and is, preferably, in the range of 10 to 100,000.

Instead of the polyamic acid, polyhydroxyamide, which is similar to the polyamic acid, may be used as the polymer or heat-resistant resin precursor. The polyhydroxyamide can be prepared by condensation of a bis(aminophenol) compound and a dicarboxylic acid. Specifically, an acid may be reacted with a dehydration condensing agent, such as dicyclohexylcarbodiimide (DCC), followed by adding a bis(aminophenol) compound, or a dicarbonyl dichloride may be added to a solution of bis(aminophenol) compound containing a tertiary amine, such as pyridine.

In use of polyhydroxyamide, by adding a sensitizer, such as naphthoquinonediazidesulfonate, to a polyhydroxyamide solution, a positive photosensitive heat-resistant resin precursor composition can be provided whose area exposed to UV light can be removed by aqueous alkaline solution.

In addition, in order to increase adhesion properties of the resulting polymer to the substrate, $R^1$ and $R^2$ may be copolymerized with an aliphatic group having a siloxane structure unless the heat resistance is negatively affected. Specifically, $R^1$ and $R^2$ may be copolymerized with 1 to 10 molar percent of bis(3-aminopropyl)tetramethyldisiloxane, bis(p-aminophenyl)octamethylpentasiloxane, or other diamine components.

The photosensitive resin precursor composition of the present invention may be composed of only the structural unit expressed by formula (1), or it may be a copolymer or a mixture with other structural units. In this instance, preferably, the photosensitive resin precursor composition contains 50 molar percent or more of the structural unit expressed by formula (1). More preferably, it contains 70 molar percent or more, still more preferably 90 molar percent or more, of the structural unit of formula (1). Preferably, the type and quantity of other structural units used in the copolymer or the mixture are selected so as not to negatively affect the heat resistance of the resulting polyimide polymer obtained by final heat treatment.

In the present invention, the end of the polymer of formula (1) may be reacted with an end cap compound. Exemplary end cap compounds include monoamines, acid anhydrides, monocarboxylic acids, monoacid chlorides, and activated monoesters. The reaction with an end cap compound advantageously controls the number of repeating units, that is, the molecular weight, of the polymer or constituent (a). Also, by reacting constituent (a) with an end cap compound, various types of organic group can be introduced as an end group. Preferably, the polymer comprising the polymer of formula (1) reacted with an end cap compound has a structure expressed by following formulas (9) to (12):

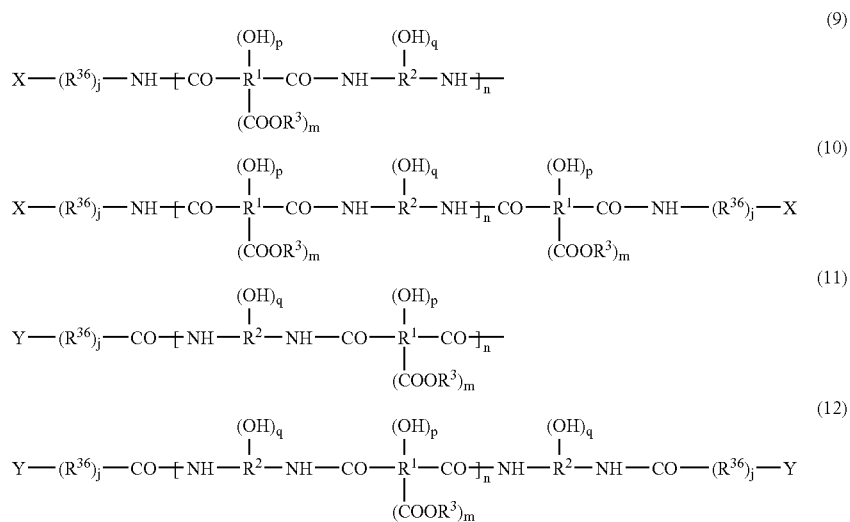

$R^{36}$ in formulas (9) to (12) is a divalent group selected from among $-CR^{37}R^{38}-$, $-CH_2O-$, and $-CH_2SO_2-$. $R^{37}$ and $R^{38}$ each represent hydrogen or a monovalent hydrocarbon group having a carbon number in the range of 1 to 10. Preferably, $R^{37}$ and $R^{38}$ are each hydrogen or a hydrocarbon group having a carbon number in the range of 1 to 4, and particularly hydrogen, the methyl group, or the t-butyl group. j represents an integer in the range of 0 to 10, and preferably in the range of 0 to 4.

$-NH-(R^{36})_j-X$ in formulas (9) and (10) is derived from a primary monoamine used as the end cap compound, and $-CO-(R^{36})_j-Y$ in formulas (11) and (12) is derived from an acid anhydride, a monocarboxylic acid, a monoacid chloride, or activated monoester compound used as the end cap compound.

Monoamines used as the end cap compound include, but not limited to, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy- 5 -aminonaphthalene, 1 -hydroxy-4-aminonaphthalene, 1 -hydroxy-3 -aminonaphthalene, 1-hydroxy-2 -aminonaphthalene. 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ammelide, 2-aminobenzoic acid, 3-aminobenzoic acid, 4-aminobenzoic acid, 2-aminobenzenesulfonic acid 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene.

Among these preferred are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline, and 3,5-diethynylaniline.

Examples of the compounds selected from the group consisting of acid anhydrides, monocarboxylic acids, monoacid chloride compounds and activated monoester compounds used as the end cap compound include phthalic anhydride, maleic anhydride, nadic anhydride, cyclohexanedicarboxylic anhydride, and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid, as well as monoacid cholorides thereof; monoacid chlorides of dicarboxylic acids (i.e., only one carboxyl group of the two carboxyl groups is converted to acid chloride) such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; and activated monoester compounds obtained by reacting the above-mentioned monoacid chloride and N-hydroxybenzotriazole or N-hydroxy-5-norbornene-2,3-dicarboxyimide.

Among these end cap compounds, preferred are: acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid and 3,5-diethynylbenzoic acid, as well as monoacid chlorides thereof; monoacid chlorides of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene; and activated monoester compounds obtained by reacting the above-mentioned monoacid chloride compound and N-hydroxybenzotriazole or N-hydroxy-5-norbornene-2,3-dicarboxyimide.

The content of the monoamine used as the end cap compound is preferably in the range of 0.1 to 60 molar percent relative to the total of the amine components, and more preferably in the range of 5 to 50 molar percent. For acid anhydride, monocarboxylic acid, monoacid chloride, and activated monoester compound, the end cap compound content is preferably in the range of 0.1 to 100 molar percent relative to the diamine components, and more preferably in the range of 5 to 90 molar percent. A plurality of types of end cap compound may be brought into reaction to introduce a plurality of types of end group.

The end cap compound introduced to the polymer is easily detected by the following method. For example, a polymer to which an end cap compound is introduced is dissolved in an acid solution to decompose the structural unit of the polymer into amine components and acid anhydride components, and the resulting solution is subjected to gas chromatography (GC) or NMR. Alternatively, the polymer to which the end cap compound is introduced is directly subjected to pyrolysis gas chromatography (PGC) or measurement of infrared spectrum and $C^{12}$ NMR spectrum.

The polymer essentially composed of a structural unit expressed by formula (1) is synthesized by the following process. For a polyamic acid or a polyamic ester, a tetracarboxylic dianhydride may be reacted with a diamine compound at a low temperature, or a diester prepared from a tetracarboxylic dianhydride and an alcohol may be reacted with an amine in the presence of a condensing agent. Also, a diester may be prepared from a tetracarboxylic dianhydride and an alcohol, and the rest of the dicarboxylic acid may be subjected to acid chlorination and subsequently to a reaction with an amine.

For a polyhydroxyamide, a bis(aminophenol) compound may be subjected to condensation with a dicarboxylic acid. Specifically, an acid may be reacted with a dehydration condensing agent, such as dicyclohexylcarbodiimide (DCC), followed by adding a bis(aminophenol) compound, or a dicarbonyl dichloride may be added to a solution of bis (aminophenol) compound containing a tertiary amine, such as pyridine.

The photosensitive resin precursor composition of the present invention contains at least two photo acid generators as constituent (b). At least one of the photo acid generators is intended to provide positive photosensitivity; at least another one is intended to appropriately stabilize the acid component produced by exposure of the photo acid generator for providing positive photosensitivity. Consequently, the photosensitive resin precursor composition exhibits superior storage stability after exposure. Preferably, the photo acid generator for providing positive photosensitivity is a quinone diazide compound. The quinone diazide compound may be formed by a sulfonic ester bond between a quinonediazidesulfonic acid and a polyhydroxy compound, a sulfonamide bond between a quinonediazidesulfonic acid and a polyamino compound, or a sulfonic ester bond and/or a sulfonamide bond between a quinonediazidesulfonic acid and a polyhydroxypolyamino compound. Although all the functional groups of the polyhydroxy and polyamino compounds are not necessarily replaced with the quinone diazide, preferably, at least 50 molar percent of the functional groups is replaced. Substitution of less than 50 molar percent could excessively increase the solubility in alkali developers to prevent providing contrast between exposed areas and unexposed areas, thus preventing the formation of desired patterns. By using quinone diazide compound described above, the resulting positive photosensitive resin precursor composition has sensitivity to the i-line(365 nm), h-line(405 nm), and g-line(436 nm) of mercury lamps, which are commonly used UV rays.

Exemplary polyhydroxy compounds include, but not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-M TrisPC, TriML-P, TriML-35XL, TML-BP, TML-HQ, TML-pp-BPF, TML-BPA, TMOM-BP, HML-TPPHBA, and HML-TPHAP (trade names, each produced by Honshu Chemical Industry Co., Ltd.); BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, each produced by Asahi Organic Chemicals Industry Co., Ltd.); 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, and methylene bisphenol; and BisP-AP (trade name, produced by Honshu Chemical Industry Co., Ltd.).

Exemplary polyamino compounds include, but not limited to, 1,4-phenylenediamine, 1,3-phenylenediamine, 4,4'-diaminodiphenyl ether, 4,4'-diaminodiphenylmethane, 4,4'-diaminodiphenyl sulfone, and 4,4'-diaminodiphenyl sulfide.

Exemplary polyhydroxypolyamino compounds include, but not limited to, 2,2-bis(3-amino-4-hydroxyphenyl) hexafluoropropane and 3,3'-dihydroxybenzidine.

A 5-naphthoquinonediazidesulfonyl group or a 4-naphthoquinonediazidesulfonyl group may preferably be used for the quinone diazide. 4-Naphthoquinonediazidesulfonyl ester compounds can absorb the i-line of the mercury lamp, and are thus suitable for i-line exposure. Since 5-naphthoquinonediazidesulfonyl ester compounds have an absorption band extending to the g-line region, they are suitable for g-line exposure. In the present invention, it is preferable that 4-naphthoquinonediazidesulfonyl ester or 5-naphthoquinonediazidesulfonyl ester be selected according to the wavelength of the exposure light. Also, a naphthoquinonediazidesulfonyl ester having both 4-naphthoquinonediazidesulfonyl group and 5-naphthoquinonediazidesulfonyl group in its molecule may be used, or a mixture of a 4-naphthoquinonediazidesulfonyl ester and a 5-naphthoquinonediazidesulfonyl ester may also be used.

A quinone diazide compound having a molecular weight of over 1,500 may negatively affect the heat resistance, mechanical characteristics, and adhesion properties of the resulting film because the compound is not sufficiently decomposed by the subsequent heat treatment. Accordingly, a preferred molecular weight of the naphthoquinone diazide compound is in the range of 300 to 1,500. More preferably, it is in the range of 350 to 1,200.

The quinone diazide compound content is preferably in the range of 1 to 50 parts by weight relative to 100 parts by weight of the polymer, and more preferably in the range of 3 to 40 parts by weight.

The quinone diazide compound may be synthesized from a specific phenol compound by the following process. For example, 5-naphthoquinonediazidesulfonyl chloride is reacted with the phenol compound in the presence of triethylamine. The phenol compound may be synthesized by reacting a α-(hydroxyphenyl)styrene derivative with a multivalent phenol compound in the presence of an acid catalyst.

Another photo acid generator in constituent (b) for appropriately stabilizing the acid component produced by the exposure is preferably selected from among sulfonium salts, phosphonium salts, and diazonium salts. These compounds extremely increase the storage stability after exposure. Since the resulting resin film prepared from the photosensitive resin precursor composition of the present invention is permanently used, the presence of phosphorus or the like is not preferable in view of environmental protection. Also, it is necessary to allow for the film color. Accordingly, sulfonium salts are preferably used. Preferred sulfonium salts are expressed by formula (14) to (16):

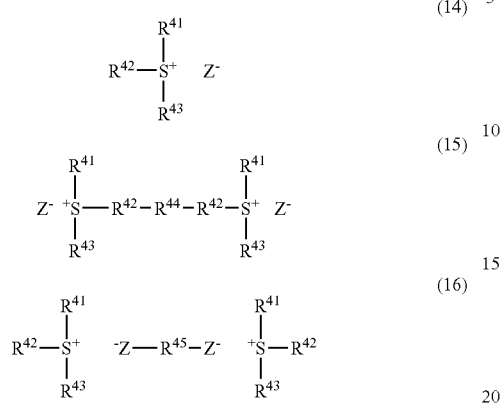

In the formulas (14) to (16), $R^{41}$ to $R^{43}$ may be the same or different, and each represent an organic group having a carbon number in the range of 1 to 20. $R^{44}$ and $R^{45}$ each represent a single bond or an organic group having a carbon number in the range of 1 to 20. $Z^-$ represents an anion portion selected from $R^{46}SO_3^-$, $R^{46}COO^-$, and $SbF_6^-$. $R^{46}$ represents an organic group having a carbon number in the range of 1 to 20. Exemplary sulfonium salts expressed by formula (14) include, but not limited to, the following:

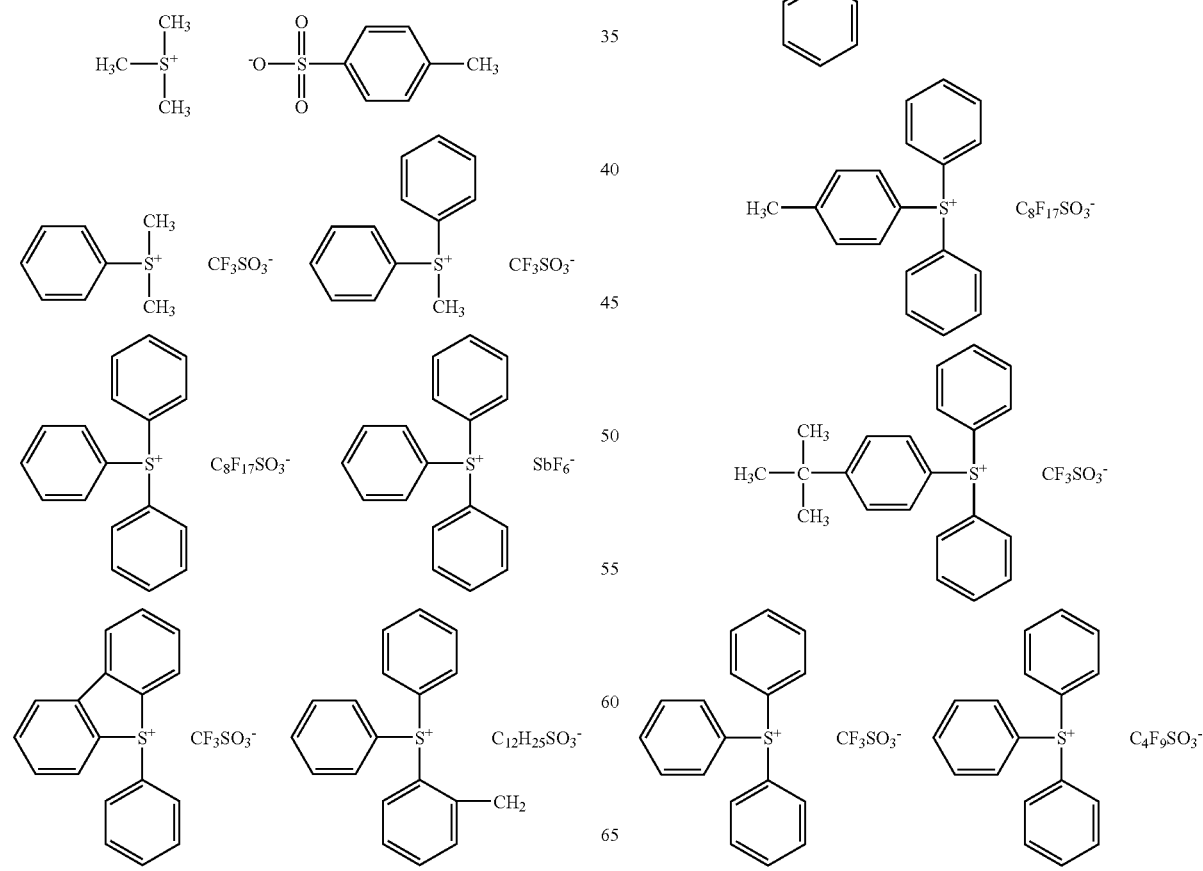

-continued

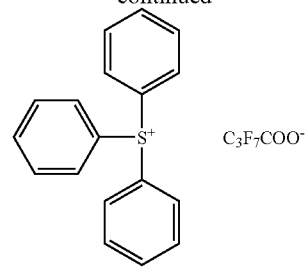
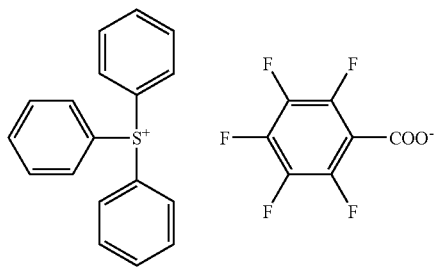
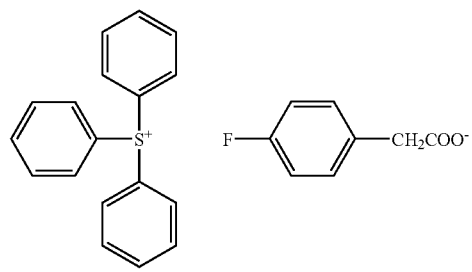
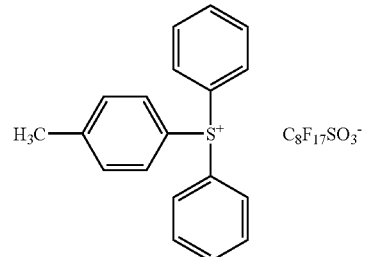
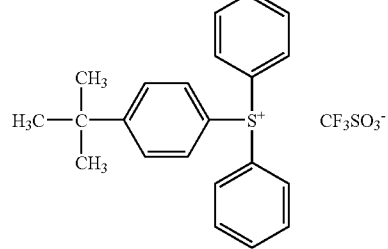
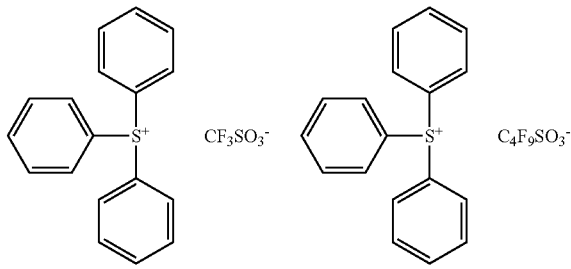

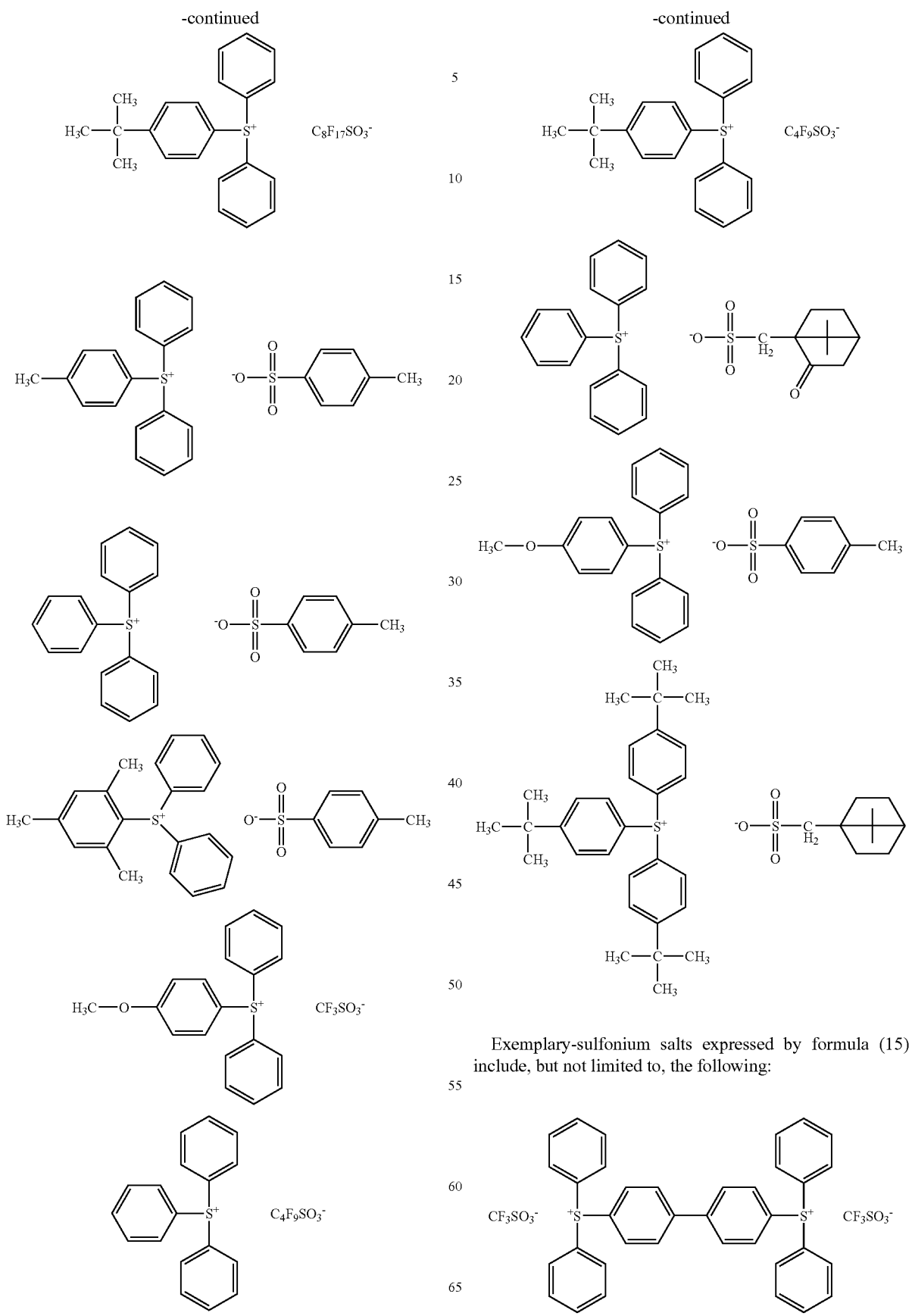
Exemplary-sulfonium salts expressed by formula (15) include, but not limited to, the following:

-continued
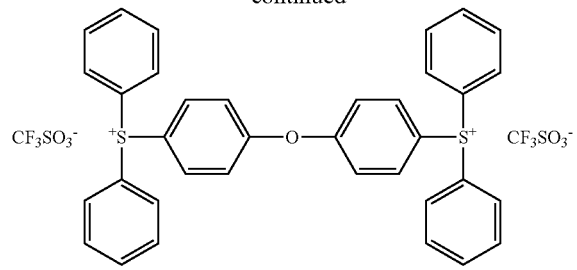
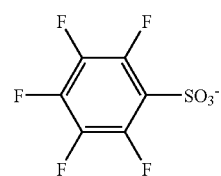
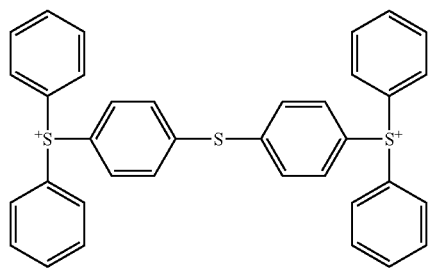
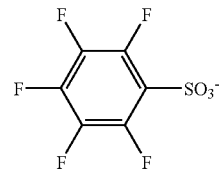
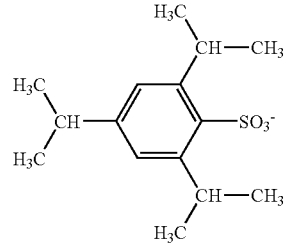
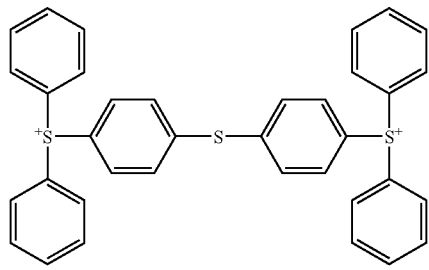
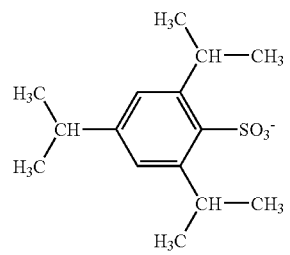
Exemplary sulfonium salts expressed by formula (16) include, but not limited to, the following:
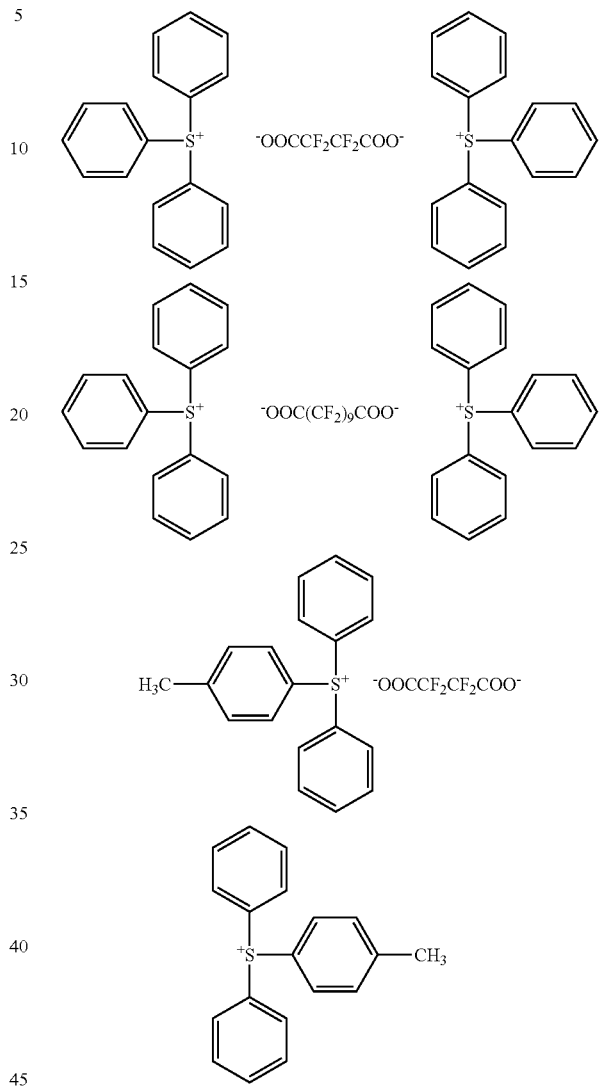
A particularly preferred sulfonium salt is a triarylsulfonium salt expressed by formula (13):
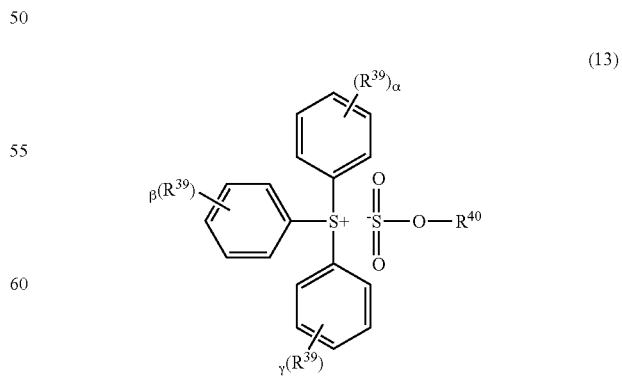
$R^{39}$ may be the same or different, and each represent hydrogen or an organic group having a carbon number in the range of 1 to 20. $R^{40}$ represents an organic group having a carbon number in the range of 1 to 20. α, β, and γ each represent an integer in the range of 0 to 5.
Exemplary triarylsulfonium salts expressed by formula (13) include, but not limited to, the following:
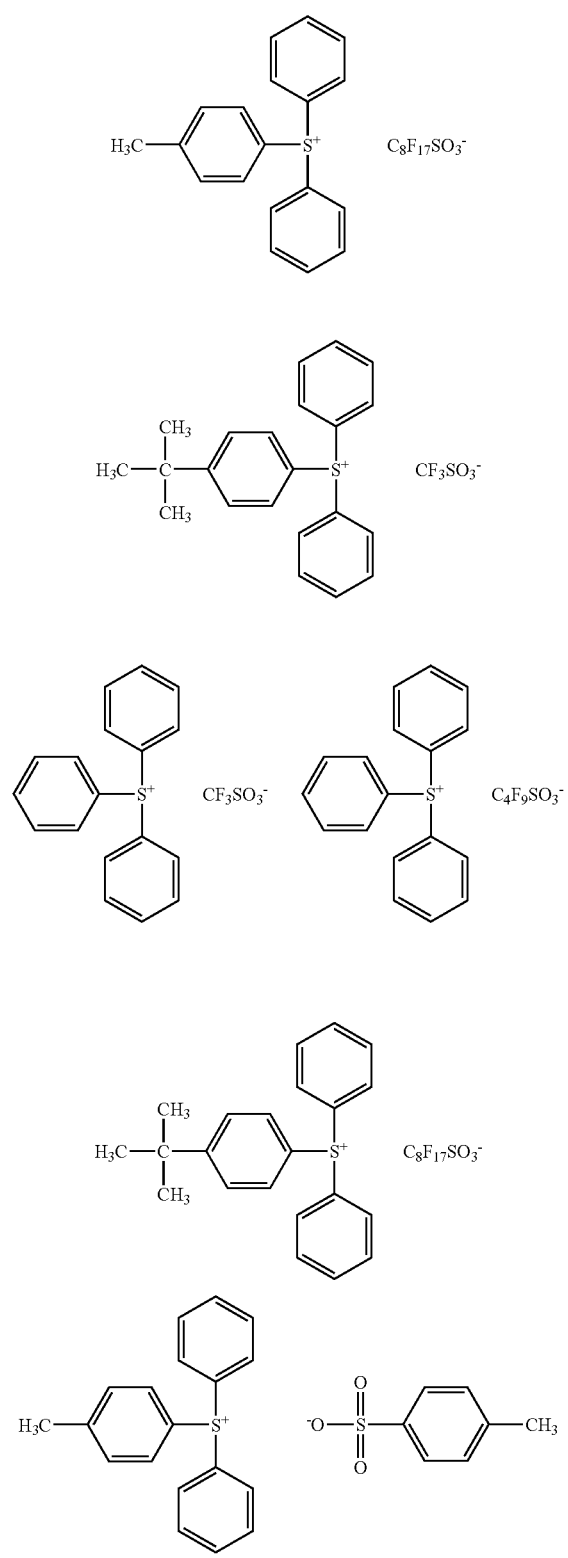
-continued
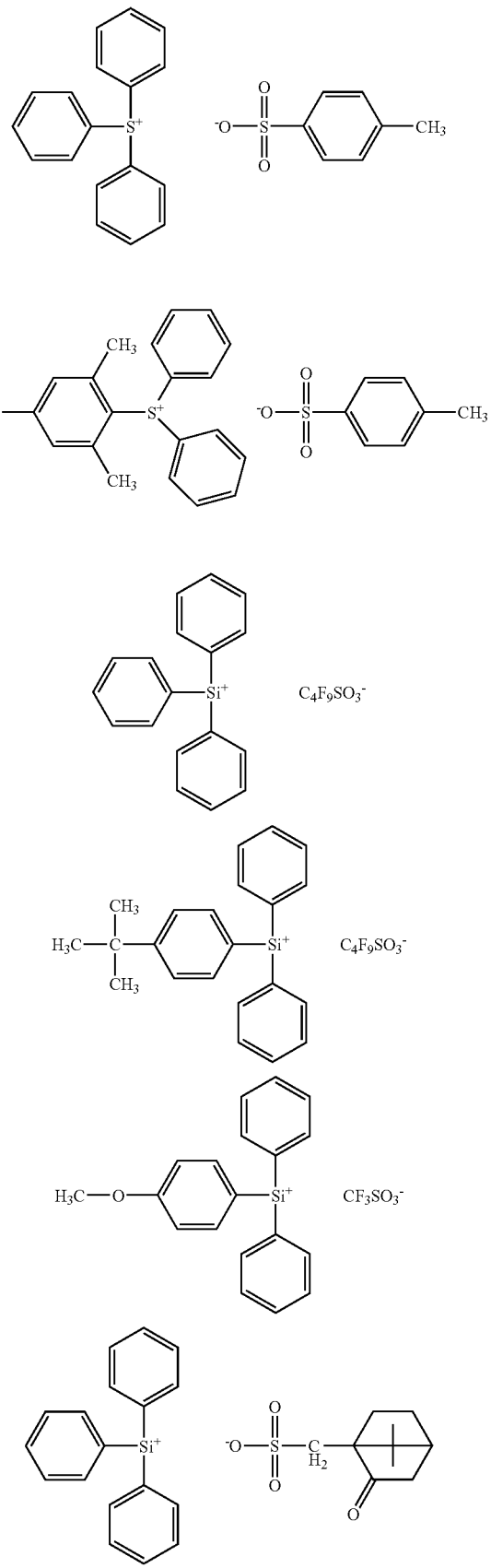

-continued

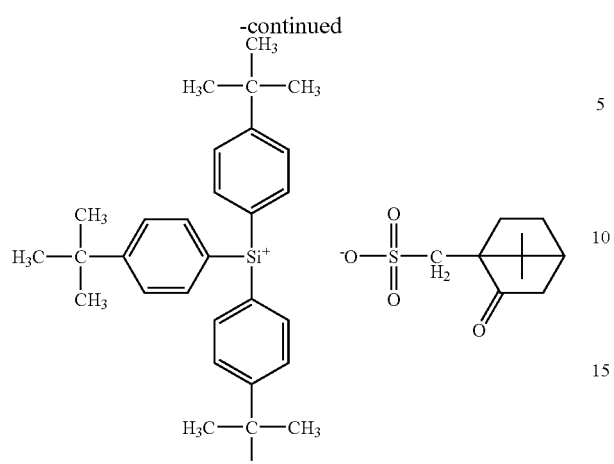

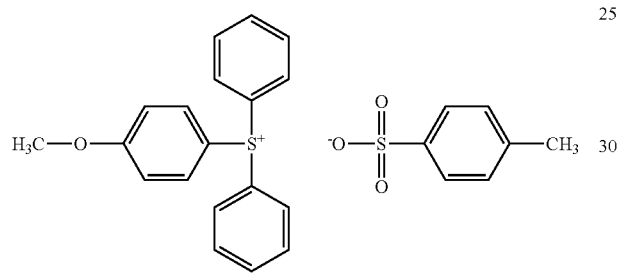

Preferably, the contents of the photo acid generators used as constituent (b) are each in the range of 0.01 to 50 parts by weight relative to 100 parts by weight of the polymer. The quinone diazide compound content is preferably in the range of 3 to 40 parts by weight, and the content of the compound selected from among sulfonium salts, phosphonium salts, and diazonium salts is preferably in the range of 0.05 to 10 parts by weight.

The photosensitive resin precursor composition of the present invention contains a compound having an alkoxymethyl group as constituent (c). If the compound does not have an alkyl group, that is, if it has a methylol group instead of the alkoxymethyl group, the storage stability after exposure is disadvantageously degraded. Preferably, the compound having an alkoxymethyl group comprises a compound having a phenolic hydroxy group and/or a compound having a ureal organic group expressed by formula (2):

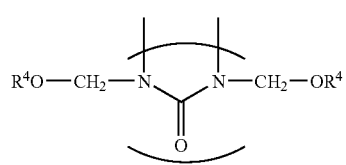

(2)

Examples of the compound having a phenolic hydroxy group include, but not limited to, the following compounds:

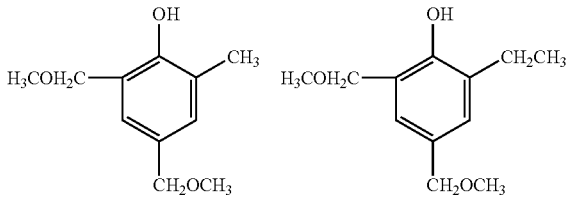

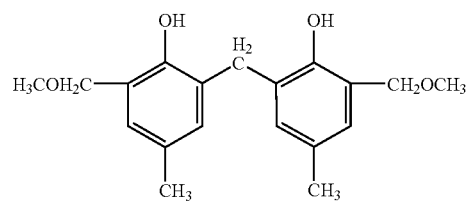

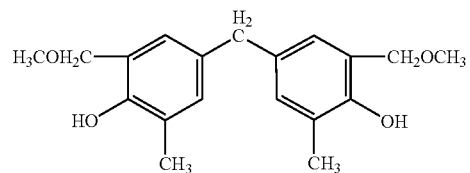

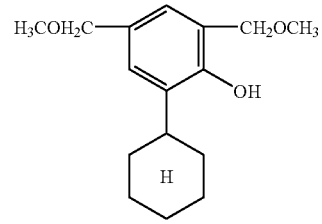

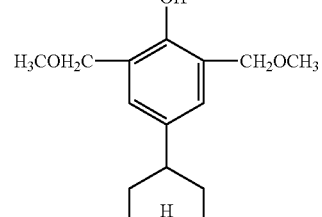

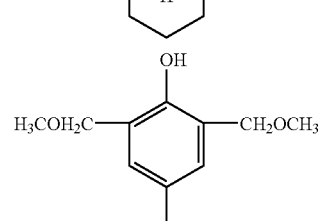

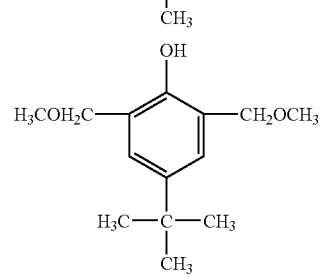

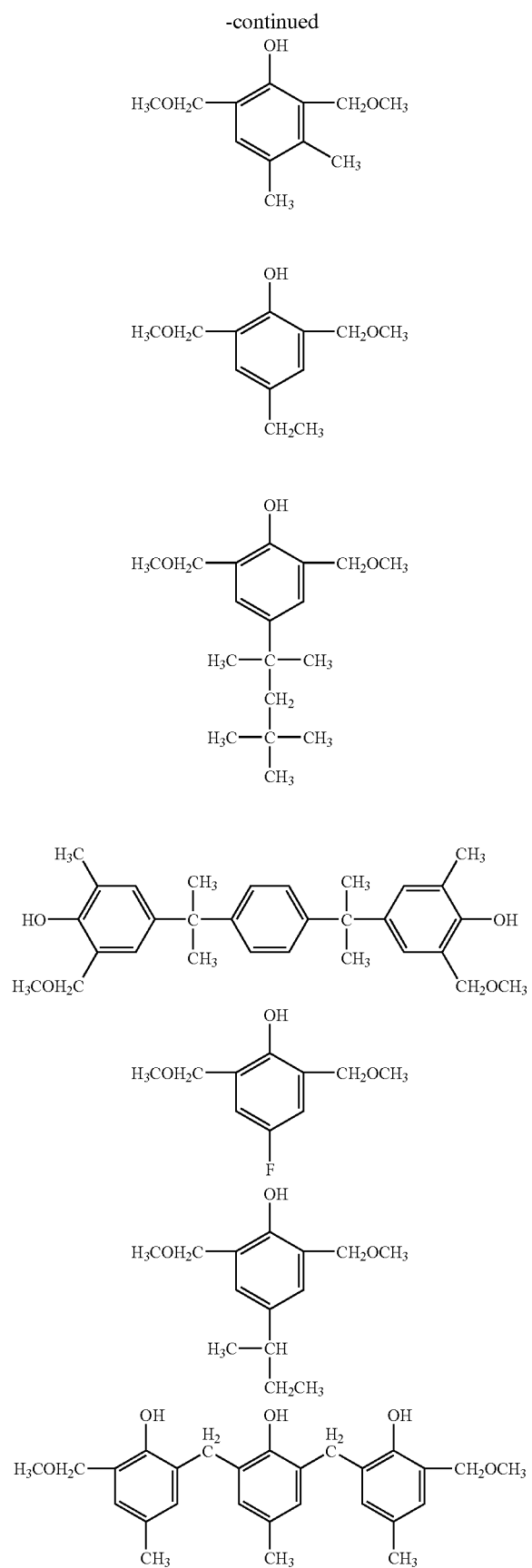
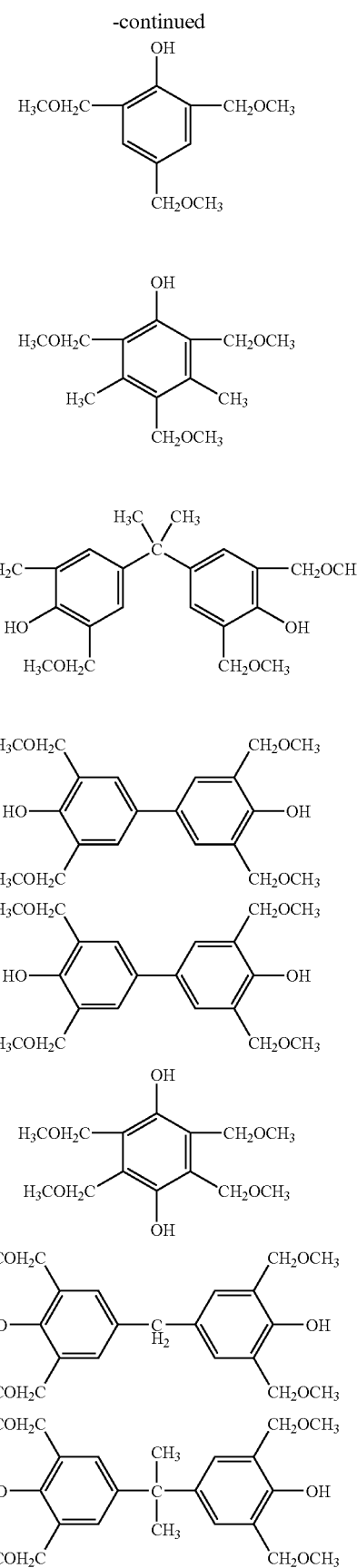

-continued

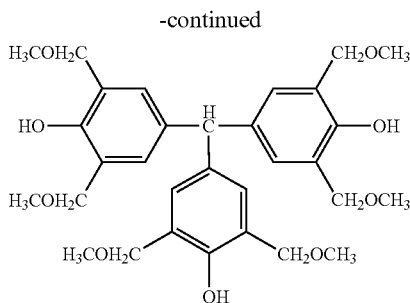

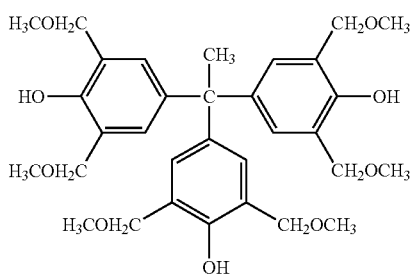

$R^4$ in formula (2) represents an alkyl group having a carbon number in the range of 1 to 20, and the carbon number is preferably in the range of 1 to 10, more preferably 1 to 3, from the viewpoint of the compatibility with the resin precursor composition. Examples of the compound being constituent (c) having the ureal organic group expressed by formula (2) include, but not limited to, the following:

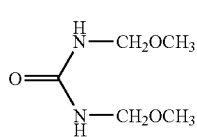
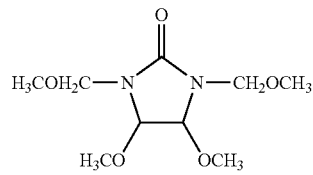

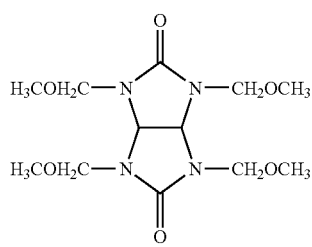

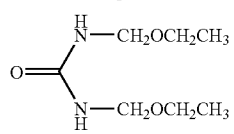

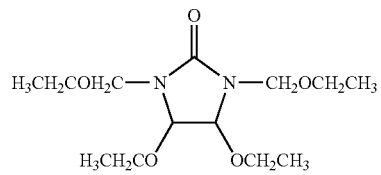

-continued

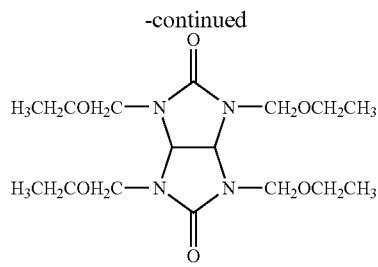

These compounds are thermally cross-linkable. By adding such a cross-linkable compound, the photosensitive resin precursor composition becomes soluble easily in an alkaline developer by exposure though it is hardly dissolved in the alkaline developer before exposure. Consequently, the thickness of the film does not reduced by development and the development can be completed in a short time. In addition, the film shrinkage by curing is reduced.

In particular, compounds having the group expressed by formula (2) exhibits an extremely lower exposure light absorption than that of thermally cross-linkable aromatic compounds. Accordingly, the sensitization efficiency of the sensitizer is enhanced by exposure, and thus, the composition becomes soluble in alkaline developers and development can be completed in a short time. Also, the compounds are more heat-resistant than aliphatic compounds because they are cyclic.

The content of the compound having an alkoxymethyl group is preferably in the range of 0.5 to 50 parts by weight relative to 100 parts by weight of the polymer, and more preferably in the range of 3 to 40 parts by weight.

Preferably, the photosensitive resin precursor composition further contains at least one compound selected from the group consisting of compounds expressed by formulas (3) and (4) and vinylsilane compounds as constituent (d). These compounds enhance the adhesion to the substrate.

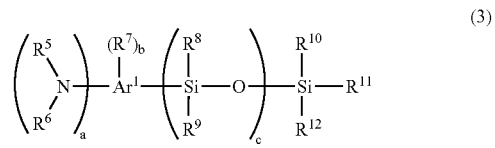

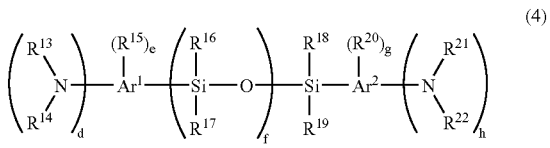

$Ar^1$ and $Ar^2$ in formulas (3) and (4) each represent an aromatic ring having at least six carbon atoms or an aromatic heterocyclic structure having at least two carbon atoms. Examples of such groups include, but not limited to, phenyl, naphthalene, biphenyl, triazine, and pyridine.

$R^5$, $R^6$, $R^{12}$, $R^{14}$, $R^{21}$, and $R^{22}$ may be the same or different, and each represent hydrogen or an organic group having a carbon number in the range of 1 to 4. Exemplary organic group having a carbon number in the range of 1 to 4 include hydrocarbon groups, such as methyl, ethyl, and propyl; and carbonyl groups, such as acetyl. A carbon number of 5 or more undesirably increases film shrinkage by curing. $R^7$, $R^{15}$, and $R^{20}$ may be the same or different, and each represent an organic group having a carbon number in the range of 1 to 6;

$R^8$ to $R^{12}$ and $R^{16}$ to $R^{19}$ may be the same or different, and each represent a hydrocarbon group having a carbon number in the range of 1 to 6, an alkoxy group having a carbon number in the range of 1 to 6, or a phenyl group. At least one of the groups $R^8$ to $R^{12}$ and $R^{16}$ to $R^{19}$ has an alkoxy group having a carbon number in the range of 1 to 6. Such hydrocarbon groups include, but not limited to, methyl, ethyl, and propyl. Exemplary alkoxy groups include, but not limited to, methoxy, ethoxy, n-propoxy, isopropoxy, n-butoxy, and isobutoxy. A carbon number of 7 or more of the hydrocarbon group or the alkoxy group undesirably increases film shrinkage by curing. Exemplary compounds expressed by formulas (3) and (4) include, but not limited to, the following compounds:

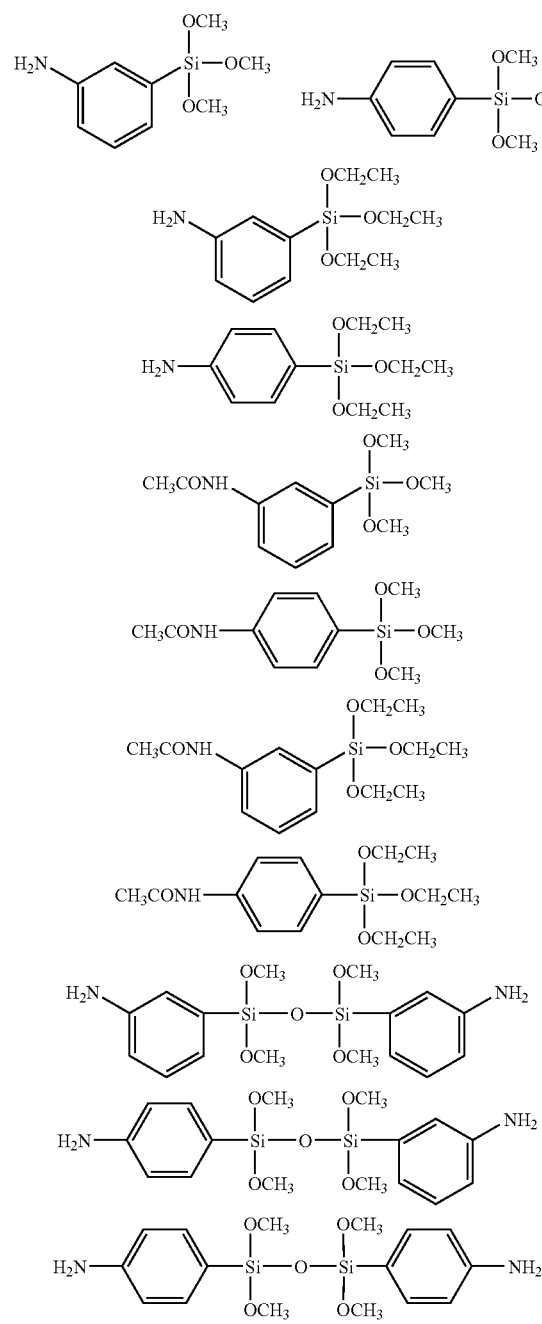

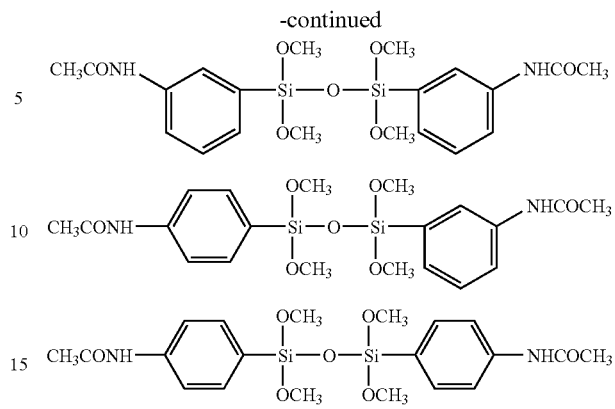

Among these preferred are the following compounds:

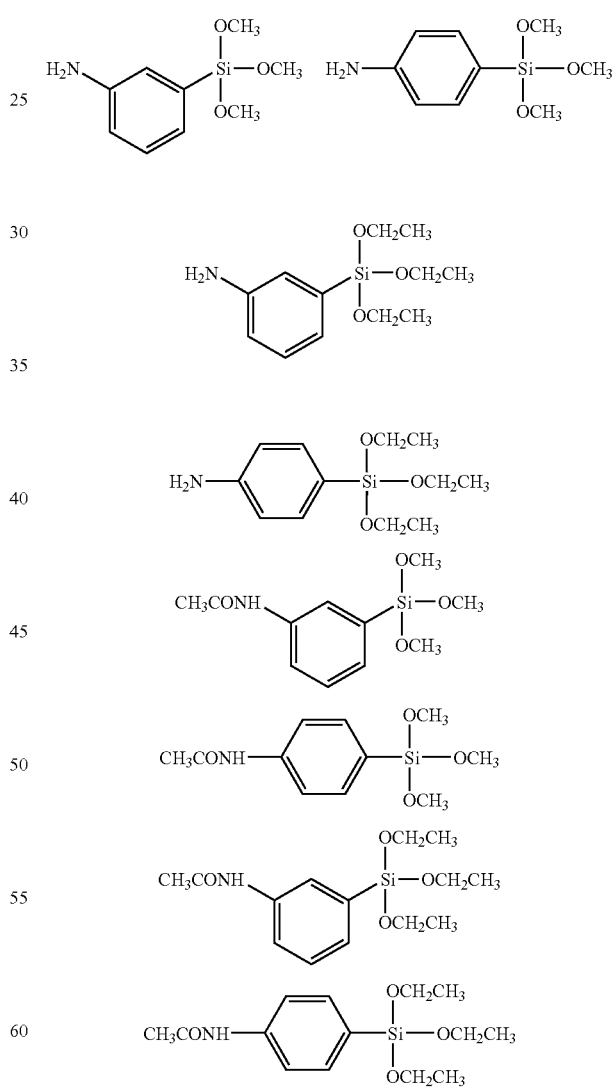

The vinylsilane compound may be vinyltrimethoxysilane, vinyltriethoxysilane, vinyltrichlorosilane, or vinyltris(β-methoxyethoxy)silane. Alternatively, a silane compound having an unsaturated carbon-carbon bond may be used, such as 3-methacryloxypropyltrimethoxysilane, 3-acryloxypropyltrimethoxysilane, p-styryltrimethoxysilane, 3-methacryloxypropylmethyldimethoxysilane, or 3-methacryloxypropylmethyldiethoxysilane. Preferably, vinyltrimethoxysilane or vinyltriethoxysilane is used.

The compounds expressed by formulas (3) and (4) and the vinylsilane compounds may be used singly or in combination, and either case can provide superior adhesion to various types of substrate.

The compounds expressed by formulas (3) and (4) and the vinylsilane compound, or constituent (d), are each added in an amount in the range of 0.001 to 30 parts by weight relative to 100 parts by weight of the polymer, preferably in the range of 0.005 to 20 parts by weight, and more preferably in the range of 0.01 to 15 parts by weight. A content of less than such an amount may not produce the effect of enhancing the adhesion, and a content of more than such an amount may negatively affect the heat resistance of the composition.

Preferably, constituent (d) is added after the completion of the polymerization of the polymer. If a compound acting as constituent (d) is added during polymerization, it may be captured in the principal chain of the polymer by a covalent bond to reduce the adhesion effect. Also, the unreacted part of the compound may be removed to reduce the adhesion effect if the polymer is reprecipitated, or condensation of the alkoxy group may undesirably cause gelation. Preferably, the compound is added while or after the reprecipitated polymer is redissolved in a solvent.

In order to enhance the photosensitivity of the photosensitive resin precursor composition, a compound having a phenolic hydroxy group may further be added, if necessary.

Examples of the compound having a phenolic hydroxy group include: Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, and BisRS-OCHP (trade names, each produced by Honshu Chemical Industry Co., Ltd.); and BIR-OC, BIP-PC, BIR-PC, BIR-PTBP, BIR-PCHP, BIP-BIOC-F, 4PC, BIR-BIPC-F, and TEP-BIP-A (trade names, each produced by Asahi Organic Chemicals Industry Co., Ltd.).

In these compounds having a phenolic hydroxy group, preferred compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, BIP-PC, BIR-PC, BIR-PTBP, and BIR-BIPC-F. Among these more preferred are, for example, Bis-Z, TekP-4HBPA, TrisP-HAP, TrisP-PA, BisRS-2P, BisRS-3P, BIR-PC, BIR-PTBP, and BIR-BIPC-F. By adding a compound having a phenolic hydroxy group, the resulting resin composition becomes soluble easily in an alkaline developer by exposure though it is hardly dissolved in the alkaline developer before exposure. Consequently, the thickness of the film does not reduced by development and the development can be completed in a short time.

The content of the compound having a phenolic hydroxy group is preferably in the range of 1 to 50 parts by weight relative to 100 parts by weight of the polymer, and more preferably in the range of 3 to 40 parts by weight.

In addition, in order to enhance the wettability between the substrate and the photosensitive resin precursor composition may be added a surfactant, an ester such as ethyl lactate or propylene glycol monomethyl ether acetate, an alcohol such as ethanol, a ketone such as cyclohexanone or methyl isobutyl ketone, or an ether such as tetrahydrofuran or dioxane, if necessary. Also, organic particles, such as of silicon dioxide or titanium dioxide, or polyimide powder may be added.

Furthermore, in order to enhance the adhesion to the substrate, such as a silicon wafer, the substrate may be pretreated with the above-described compound for enhancing adhesion properties. In this instance, the substrate is surface-treated by spin coating, immersion, spray coating, or steaming, with a solution of 0.5 to 20 percent by weight of the adhesion-enhancing compound in a solvent, such as isopropyl alcohol, ethanol, methanol, water, tetrahydrofuran, propylene glycol monomethyl ether acetate, propylene glycol monomethyl ether, ethyl lactate, or diethyl adipate. Then, in some cases, the substrate is heated to a temperature of 50 to 300° C. to promote the reaction of the adhesion-enhancing compound with the substrate.

The photosensitive resin precursor composition of the present invention may further contain a colorant as constituent (e) to color the resulting heat-resistant resin coating. Such colorants include dyes (e1), organic pigments (e2), inorganic pigments (e3), and heat-sensitive compounds (e4) whose color is developed by heating.

The dye (e1) is preferably soluble in the organic solvent which dissolves the polymer or constituent (a), and compatible with resin. Preferred dyes include oil colors, disperse dyes, reactive dyes, acid dyes, and direct dyes. The skeleton of the dye may be formed of an anthraquinone dye, an azo dye, a phthalocyanine dye, a methine dye, or an oxazine dye. These dyes may contain a metal complex. Preferably, a phthalocyanine dye or a metal complex containing dye is used from the viewpoint of heat resistance and light resistance. Examples of such dyes include Sumilan and Lanyl (produced by Sumitomo Chemical Industry Co., Ltd.); Orasol Dyes, Oracet Dyes, Filamid Dyes, and Irgasperse Dyes (produced by Ciba Specialty Chemicals Co., Ltd.); Zapon Dyes, Neozapon Dyes, Neptune Dyes, and Acidol Dyes (produced by BASF); Kayaset Dyes and Kayakalan Dyes (produced by Nippon Kayaku Co., Ltd.); Valifast colors Dyes (produced by Orient Chemical Co., Ltd.); Savinyl Dyes, Sandoplast Dyes, Polysynthren Dyes, and Lanasyn Dyes (Produced by Clariant Japan Co., Ltd.); and Aizen Spilon Dyes (produced by Hodogaya Chemical Co., Ltd.). These dyes may be used singly or in combination.

The organic pigment (e2) preferably exhibits good coloration and high heat resistance. In particular, it is preferable that the organic pigment comprise carbon black and/or a combination of at least two organic pigments. Exemplary carbon blacks include: furnace blacks, such as HCF, MCF, LFF, RCF, SAF, ISAF, HAF, XCF, FEF, GPF, and SRF; thermal blacks, such as FT and MT; channel blacks; and acetylene blacks. These carbon blacks may be used singly or in combination.

Preferably, the organic pigments are heat-resistant. Exemplary pigments are listed below by color index (IC) number. Yellow pigments include, for example, Pigment Yellows 12, 13, 14, 17, 20, 24, 31, 55, 83, 86, 93, 94, 109, 110, 117, 125, 137, 138, 139, 147, 148, 150, 153, 154, 155, 166, 168, 173, 180, and 185. Orange pigments include, for example, Pigment Oranges 13, 31, 36, 38, 40, 42, 43, 51, 55, 59, 61, 64, 65, and 71. Red pigments include, for example, Pigment Reds 9, 97, 122, 123, 144, 149, 166, 168, 176, 177, 180, 190, 192, 209, 215, 216, 224, 242, and 254. Violet pigments include, for example, Pigment Violets 19, 23, 29, 32, 33, 36, 37, and 38. Blue pigments include, for example, Pigment Blues 15 (15:3, 15:4, 15:6), 21, 22, 60, and 64. Green pigments include, for example, Pigment Greens 7, 10, 36, and 47.

The inorganic pigment (e3) is preferably an insulative metal compound. A less insulative pigment negatively affects the function as an insulating layer. For example, in a luminescent element of an organic electroluminescent device, such a pigment could cause a short circuit to result in a serious problem. Such insulative metal compounds include manganese oxide, titanium oxide, titanium oxide nitride, chromium oxide, vanadium oxide, iron oxide, cobalt oxide, and niobium oxide. Among these compounds preferred are manganese oxide and titanium oxide nitride. The manganese oxide is generally expressed by $Mn_xO_y$ ($1<y<x\leq2$). Specifically, the manganese oxide may be $\gamma$-$MnO_2$, $\beta$-$MnO_2$, $\alpha$-$MnO_2$, $Mn_2O_3$, $Mn_3O_4$. Amorphous $Mn_xO_y$ may also be used. Preferably, the primary particle size of the manganese oxide is 100 nm or less, and more preferably 60 nm or less. The primary particle size can be obtained by the arithmetic mean using an electron microscope.

Preferred titanium oxide nitrides are generally expressed by $TiN_\alpha O_\beta$ ($0<\alpha<2.0$, $0.1<\beta<2.0$). The primary particle sized of the titanium oxide nitride is preferably 100 nm or less, and more preferably 60 nm or less, as the manganese oxide.

The heat-sensitive compound (e4) may be a generally-used thermo sensitive dye or pressure sensitive dye. Other compounds may also be used. The heat-sensitive compound may be those which color by changing the chemical structures or state of electric charge by the action of acidic groups exiting in the system during heating, or those which color by thermal oxidation reaction or the like with the oxygen in the air. The skeleton structure of the heat-sensitive compound is formed of, for example, a triarylmethane skeleton, a diarylmethane skeleton, a fluoranthene skeleton, a bislactone skeleton, a phthalide skeleton, a xanthene skeleton, a rhodamine lactam skeleton, a fluorene skeleton, a phenothiazine skeleton, a phenoxazine skeleton, or a spiropyran skeleton. Specifically, such heat-sensitive compounds include 4,4',4"-tris(dimethylamino)triphenylmethane, 4,4',4"-tris(diethylamino)-2,2',2"-trimethyltriphenylmethane, 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(3-hydroxyphenyl)methylene]bis[2,6-dimethylphenol], 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(3-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4"'-(1,2-ethanediylidene)tetrakisphenol, 4,4', 4", 4"'-(1,2-ethanediylidene)tetrakis[2-methylphenol], 4,4',4",4"'-(1,2-ethanediylidene)tetrakis[2,6-dimethylphenol], 4,4',4",4"'-(1,4-phenylenedimethylidene)tetrakisphenol, 4,4',4",4"'-(1,4-phenylenedimethylidene)tetrakis(2,6-dimethylphenol), 4,4'-[(2-hydroxyphenyl)methylene]bis[3-methylphenol], 2,2'-[(3-hydroxyphenyl)methylene]bis[3,5-dimethylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 2,2'-[(3-hydroxy-4-methoxyphenyl)methylene]bis[3,5-dimethylphenol], 4,4'-[(2-hydroxyphenyl)methylene]bis[2-methylethylphenol], 4,4'-[(3-hydroxyphenyl)methylene]bis[2-methylethylphenol], 4,4'-[(4-hydroxyphenyl)methylene]bis[2-methylethylphenol], 2,2'-[(3-hydroxyphenyl)methylene]bis[3,5,6-trimethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(3-hydroxy-4-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(3-hydroxy-4-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'[(2-hydroxyphenyl)methylene]bis[2-cyclohexylphenol], 4,4'-[(3-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(3-hydroxy-4-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol, 4,4'-(3,5-dimethyl-4-hydroxyphenylmethylene)-bis(2,6-dimethylphenol), 3,3-bis(p-dimethylaminophenol)-6-dimethylaminophthalide, 3,6-bis(dimethylamino)fluorane-γ-(4'-nitro)-aminolactam, 2-(2-chloroanilino)-6-diethylaminofluorane, 2-(2-chloroanilino)-6- dibutylaminofluorane, 2-N,N-dibenzylamino-6-diethylaminofluorane, 6-diethylamino-benzo[a]-fluorane, 2,2'-bis(2-chlorophenyl)-4,4',5,5'-tetraphenyl-1,2'-bi(imidazole), 1,3-dimethyl-6-diethylaminofluorane, 2-anilino-3-me-thyl-6-dibutylaminofluorane, 3,7-bis(dimethylamino)-10-benzoylphenothiazine, 3-diethylamino-6-chloro-7-(β-ethoxyethylamino)fluorane, 3-diethylamino-6-methyl-7-anilinofluorane, 3-triethylamino-6-methyl-7-anilinofluorane, and 3-cyclohexylamino-6-methyl-7-anilinofluorane.

Among these, compounds having a triarylmethane skeleton and containing a hydroxy group are particularly preferable because of high coloring temperature and high heat resistance. Those compounds may be used singly or in combination. The compound having a triarylmethane skeleton and containing a hydroxy group may be ester bonded with a naphthoquinonediazidesulfonic acid to be used as the quinone diazide compound.

The content of the colorant or constituent (e) is preferably in the range of 1 to 300 parts by weight relative to 100 parts by weight of the polymer or constituent (a), and more preferably in the range of 10 to 200 parts by weight. A colorant content of more than 300 parts by weight leads to a low resin content to reduce the adhesion strength between the resulting photosensitive resin coating and the substrate.

Constituent (e) is at least one used the above-describe colorants (e1) to (e4), and may be, for example, (i) a dye or an organic pigment, (ii) a mixture of at least two dyes or organic pigments, (iii) a mixture of at least one dye and at least one organic pigment, (iv) a mixture of at least one heat-sensitive compound and at least one dye, or (v) a mixture of at least one inorganic pigment and at least one heat-sensitive compound.

Solvents used in the present invention include polar aprotic solvents, such as N-methyl-2-pyrrolidone, γ-butyrolactone, N,N-dimethylformamide, N,N-dimethylacetamide, and dimethylsulfoxide; ethers, such as tetrahydrofuran, dioxane, and propylene glycol monomethyl ether; ketones, such as acetone, methyl ethyl ketone, diisobutyl ketone, and diacetone alcohol; esters, such as ethyl acetate, propylene glycol monomethyl ether acetate, and ethyl lactate; and aromatic hydrocarbons, such as toluene and xylene. These solvents may be used singly or in combination.

The solvent content is preferably in the range of 50 to 2,000 parts by weight relative to 100 parts by weight of the polymer or constituent (a), and more preferably in the range of 100 to 1,500 parts by weight.

A method for forming a heat resistant resin pattern of the photosensitive resin precursor composition of the present invention will now be described.

The photosensitive resin precursor composition is applied onto a substrate. The substrate may comprise, but not limited to, a silicon wafer, ceramic, gallium arsenide, metal, glass, an insulative metal oxide film, silicon nitride, or ITO. The application of the composition may be performed by spin coating using a spinner, spray coating, roll coating, or slit die coating. The thickness of the coating depends on the solid content in and the viscosity of the composition, but is generally set so as to be 0.1 to 150 μm after drying.

Then, the substrate coated with the photosensitive resin precursor composition is dried to form a coating. The drying is preferably performed at a temperature in the range of 50 to 150° C. for a period of time between 1 minute and several hours with an oven, a hot plate, or infrared rays.

The photosensitive resin precursor coating is exposed to actinic rays through a mask having a desired pattern. For the exposure, UV light, visible light, electron rays, or X rays are generally used as the actinic rays. Preferably, in the present invention, the i-line(365 nm), h-line (405 nm), or g-line (436 nm) of a mercury lamp is used.

For the formation of a heat-resistance resin pattern from the photosensitive resin precursor composition coating, predetermined areas of the coating are subjected to exposure, and are subsequently removed with a developer. Preferably, the developer is an aqueous solution of an alkaline compound, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In some cases, polar solvents, alcohols, esters, or ketones may be added to the aqueous alkaline solution singly or in combination. The polar solvents include N-methyl-2-pyrrolidone, N,N-dimethylformamide, N,N-dimethylacetamide, dimethylsulfoxide, γ-butyrolactone, and dimethylacrylamide. The alcohols include methanol, ethanol, and isopropyl alcohol. The esters include ethyl lactate and propylene glycol monomethyl ether acetate, and the ketones include cyclopentanone, cyclohexanone, isobuthyl ketone, and methyl isobutyl ketone. After development, the substrate is rinsed with water. For rinsing the substrate, alcohol, such as ethanol or isopropyl alcohol, or an ester, such as ethyl lactate or propylene glycol monomethyl ether acetate, may be added to the water.

Then, the pattern is heated to a temperature of 200 to 500° C. to be transformed into a heat-resistant resin coating film. Temperature is raised in stages or continuously to a predetermined range, and, thus, heat treatment is performed for a period of time between 5 minutes and 5 hours. For example, the pattern is heated to temperatures at 130° C., 200° C., and 350° C. for 30 minutes each. Alternatively, the pattern is heated from room temperature to 400° C. over a period of 2 hours so that the temperature linearly increases.

The resulting heat-resistant resin coating is used as a passivation film of semiconductors, a protective film of semiconductor elements, an insulating interlayer of multilayer wires for high density packing, an insulating layer of organic electroluminescent devices, and other films.

EXAMPLES

The present invention will be further described with reference to examples, but it is not limited to these examples. In the examples, the photosensitive resin precursor composition was evaluated according to the following.

(1) Workability of Pattern Formation

Preparation of Photosensitive Resin Precursor Coating:

The photosensitive resin precursor composition (hereinafter referred to as varnish) was applied onto a 6-inch silicon wafer so that the thickness of the prebaked coating would be 7 μm, and was, then, prebaked at 120° C. for 3 minutes on a hot plate (coater-developer Mark-7 manufactured by Tokyo Electron Limited) to form a photosensitive resin precursor coating.

Measurement of Thickness:

The thicknesses of the coating after prebaking and after development were measured at a refractive index of 1.629 with RamdaA STM-602 manufactured by Dainippon Screen Mfg. Co., Ltd; the thickness of the cured coating, at a refractive index of 1.773.

Exposure:

The photosensitive resin precursor coating was exposed to i-line radiation of 365 nm for varied time periods through a reticle in which a pattern was provided, using an exposure apparatus (i-line stepper DSW-8000, manufactured by GCA).

Development:

An aqueous solution of 2.38% tetramethylammonium hydroxide was sprayed onto the exposed coating for 10 seconds at a rotational speed of 50 rpm with a coater-developer Mark-7, produced by Tokyo Electron Limited. The coating was allowed to stand for 60 seconds without rotation, then rinsed with water at a rotational speed of 400 rpm, and dried by spinning at a rotational speed of 3,000 rpm for 10 seconds.

Calculation of Photosensitivity:

After exposure and development, the exposure time (hereinafter referred to as the optimum exposure time) for forming a 50 μm 1:1 line-and-space pattern (1L/1S) was determined.

Calculation of Resolution:

The resolution was defined as the smallest size of the pattern formed by exposure for the optimum exposure time.

Curing:

The resulting photosensitive resin precursor coating was heat-treated with an inert gas oven INH-21CD, manufactured by Koyo Thermo Systems Co., Ltd., at 140° C. for 30 minutes, subsequently at increasing temperatures to 350° C. for 1 hour, and at 350° C. for 1 hour, in a nitrogen gas flow (oxygen content: 20 ppm or less). Thus, a cured coating (heat-resistant resin film) was formed.

Calculation of Degree of Shrinkage:

The degree of shrinkage is determined according to the following equation:

Degree of shrinkage(%)=(prebaked coating thickness−cured coating thickness)/prebaked coating thickness×100

(2) Evaluation of Storage Stability after Exposure

After exposure, the coating was allowed to stand in a yellow room (23° C., 45% RH) for 48 hours and then developed. The resulting coating was evaluated for the photosensitivity, the degree of shrinkage, and the resolution of the varnish, as above.

(3) Evaluation of Adhesion to Substrate

The cured coating was provided with incisions at intervals of 2 mm like a grid with 10 rows and 10 columns, and then subjected to a pressure cooker test (PCT) for 100 hours and subsequently to peeling test with Sellotape (registered trademark). The sample resulting in less than 10 exfoliations was determined to be good; the sample resulting in 10 or more exfoliations, bad. The PCT was performed under saturated conditions at 121° C. and 2 atmospheres.

Synthesis 1: Hydroxy Group-Containing Acid Anhydride (a)

In 100 g of gamma-butyrolactone (GBL) were dissolved 18.3 g (0.05 mol) of 2,2-bis(3-amino-4-hydroxyphenyl) hexafluoropropane (BAHF) and 34.2 g (0.3 mol) of allyl glycidyl ether under a dry nitrogen gas flow, and the solution was cooled to −15° C. Into the solution was dripped 22.1 g (0.11 mol) of trimellitic anhydride chloride dissolved in 50 g of GBL such as not to increase the temperature of the solution to more than 0° C. After the completion of dripping, a reaction was performed at 0° C. for 4 hours. The resulting solution was condensed with a rotary evaporator, and put into 1 L of toluene to yield acid anhydride (a):

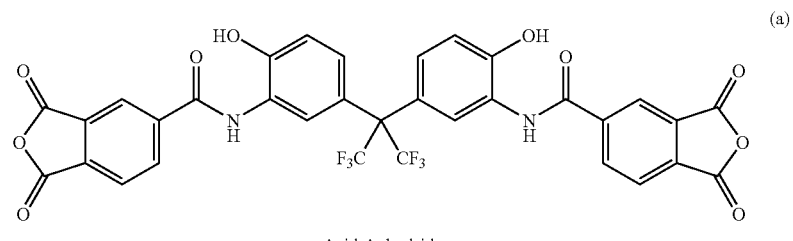

Acid Anhydride

Synthesis 2: Hydroxy Group-Containing Diamine Compound (b)

In 100 mL of acetone and 17.4 g (0.3 mol) of propylene oxide was dissolved 18.3 g (0.05 mol) of BAHF, and the solution was cooled to −15° C. A solution of 20.4 g (0.11 mol) of 4-nitrobenzoyl chloride in 100 mL of acetone was slowly dripped into the solution above. After the completion of dripping, the mixture was allowed to react at −15° C. for 4 hours and then warmed to room temperature. The resulting white precipitate was collected by filtration and vacuum-dried at 50° C.

The precipitate in a weight of 30 g was placed in a 300 mL stainless autoclave and dispersed in 250 mL of methyl Cellosolve, and 2 g of 5% palladium-carbon was added. Hydrogen was introduced into the autoclave with a balloon to perform a reduction reaction at room temperature. After about 2 hours, it was ensured that the balloon did not deflate anymore and then the reaction was finished. After the completion of the reaction, the catalyst or palladium compound was removed by filtration, and the product was condensed with a rotary evaporator to yield diamine compound (b). The resulting solid diamine compound was used without being processed.

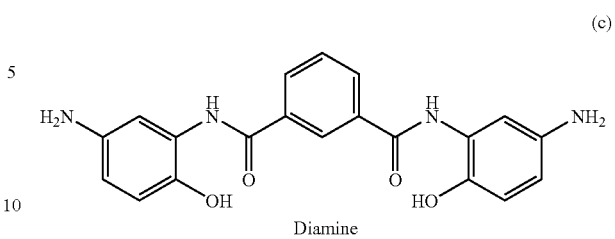

Diamine

Synthesis 4: Hydroxy Group-Containing Diamine (d)

In 100 mL of acetone and 17.4 g (0.3 mol) of propylene oxide was dissolved 15.4 g (0.1 mol) of 2-amino-4-nitrophenol, and the solution was cooled to −15° C. A solution of 20.4 g (0.11 mol) of 4-nitrobenzoyl chloride in 100 mL of acetone was gradually dripped into the solution above. After the completion of dripping, a reaction was performed at −15° C. for 4 hours. Then, the reaction mixture was warmed to room temperature to produce precipitate. The precipitate was collected by filtration. Then, crystals of the target compound were obtained as in Synthesis 2.

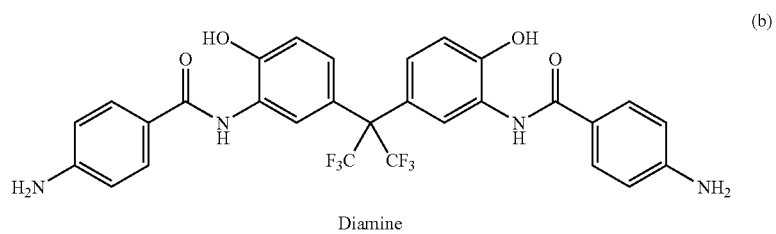

Diamine

Synthesis 3: Hydroxy Group-Containing diamine (c)

In 50 mL of acetone and 30 g (0.34 mol) of propylene oxide was dissolved 15.4 g (0.1 mol) of 2-amino-4-nitrophenol, and the solution was cooled to −15° C. A solution of 11.2 g (0.055 mol) of isophthaloyl chloride in 60 mL of acetone was dripped into the solution above. After the completion of dripping, a reaction was performed at −15° C. for 4 hours. Then, the reaction mixture was warmed to room temperature to produce precipitate. The precipitate was collected by filtration.

The precipitate was dissolved in 200 mL of GBL, and 3 g of 5% palladium-carbon was added to the solution, followed by stirring hard. Hydrogen gas was introduced to the reaction mixture from a balloon. The mixture was stirred until the balloon became such as not to deflate anymore, and further stirred for another 2 hours with the balloon attached. After stirring, the palladium compound was removed by filtration, and then the solution was condensed to half the original volume with a rotary evaporator. Ethanol was added to the condensed solution to recrystallize, and, thus, crystals of the target compound were obtained.

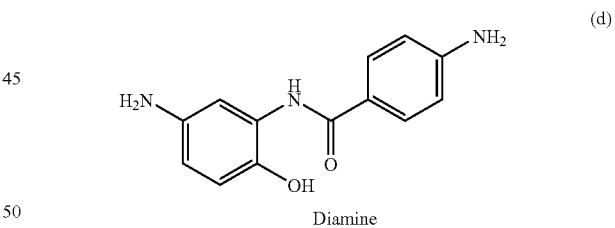

Diamine

Synthesis 5: Quinone Diazide Compound (e)

In 450 g of 1,4-dioxane were dissolved 16.1 g (0.05 mol) of BisP-RS (trade name, produced by Honshu chemical Industry Co., Ltd.) and 26.86 g (0.1 mol) of 5-naphthoquinonediazidesulfonyl chloride in a dry nitrogen gas flow, and the temperature of the solution was allowed to be room temperature. A mixture of 50 g of 1,4-dioxane and 10.12 g of triethylamine was dripped into the solution above such as not to increase the temperature to 35° C. or more. After dripping, the mixture was stirred at 30° C. for 2 hours. The triethylamine salt was removed by filtration and the filtrate was put into water. Then, the resulting precipitate was collected by filtration. The precipitate was dried in a vacuum dryer to yield quinone diazide compound (e).

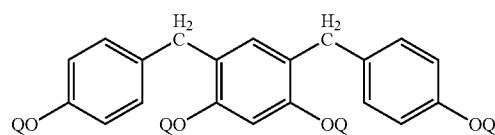

Quinone Diazide Compound (e)

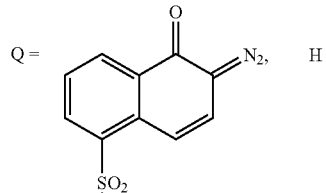

1:1

Synthesis 6: Quinone Diazide Compound (f)

In 450 g of 1,4-dioxane were dissolved 15.31 g (0.05 mol) of TrisP-HAP (trade name, produced by Honshu chemical Industry Co., Ltd.) and 40.28 g (0.15 mol) of 5-naphthoquinonediazidesulfonyl chloride in a dry nitrogen gas flow, and the temperature of the solution was allowed to be room temperature. A mixture of 50 g of 1,4-dioxane and 15.18 g of triethylamine was dripped into the solution, and quinone diazide compound (f) was prepared as in Synthesis 5.

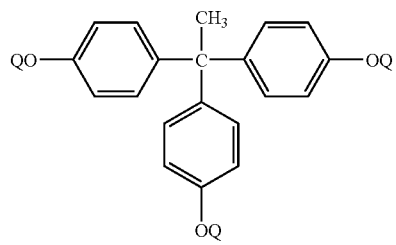

Quinone Diazide Compound (f)

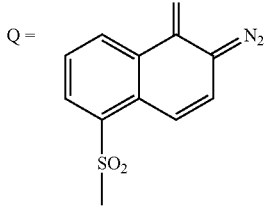

Synthesis 7: Quinone Diazide Compound (g)

In 450 g of 1,4-dioxane were dissolved 21.22 g (0.05 mol) of TrisP-PA (trade name, produced by Honshu chemical Industry Co., Ltd.), 26.86 g (0.1 mol) of 5-naphthoquinonediazidesulfonyl chloride, and 13.43 g (0.05 mol) of 4-naphthoquinonediazidesulfonyl chloride in a dry nitrogen gas flow, and the temperature of the solution was allowed to be room temperature. A mixture of 50 g of 1,4-dioxane and 12.65 g of triethylamine was dripped into the solution, and quinone diazide compound (g) was prepared as in Synthesis 5.

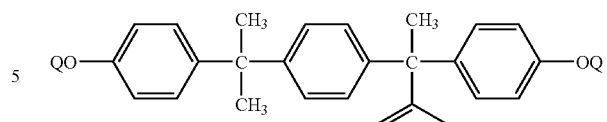

Quinone Diazide Compound (g)

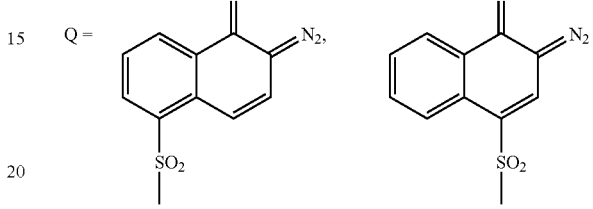

2:1

Synthesis 8: Quinone Diazide Compound (h)

In 450 g of 1,4-dioxane were dissolved 11.41 g (0.05 mol) of bisphenol A and 26.86 g (0.1 mol) of 4-naphthoquinonediazidesulfonyl chloride in a dry nitrogen gas flow, and the temperature of the solution was allowed to be room temperature. A mixture of 50 g of 1,4-dioxane and 10.12 g of triethylamine was dripped into the solution, and quinone diazide compound (h) was prepared as in Synthesis 5.

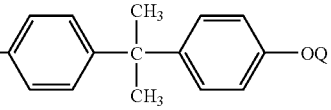

Quinone Diazide Compound (h)

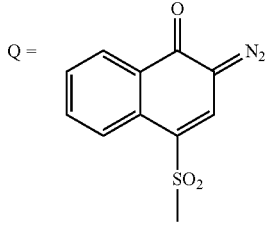

Compounds having a phenolic hydroxy group, photo acid generators, and thermally cross-linkable compounds used in the examples and comparative examples are as follows:

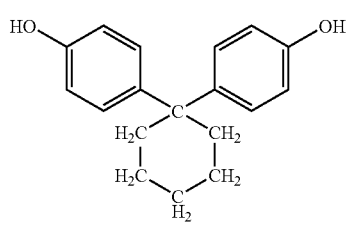

Bis-Z

-continued
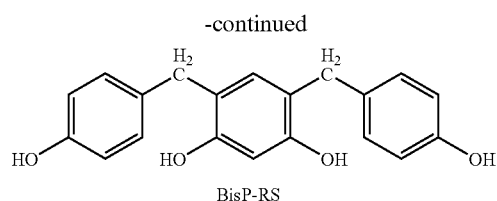
BisP-RS
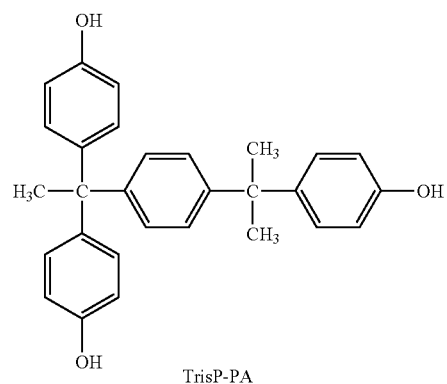
TrisP-PA
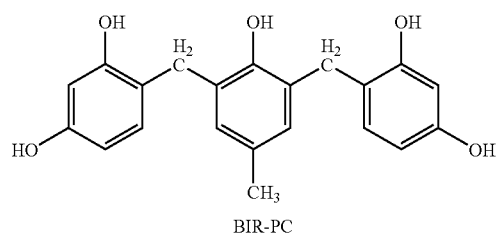
BIR-PC
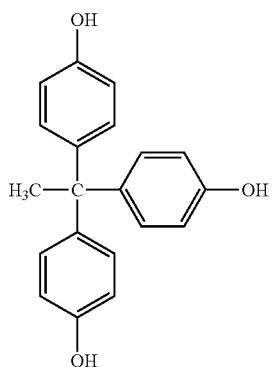
TrisP-HAP
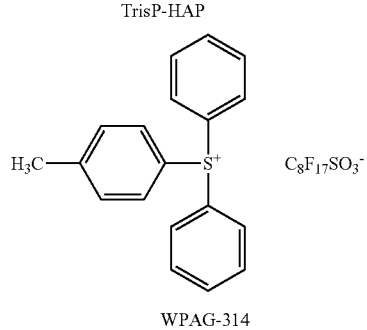
WPAG-314
-continued
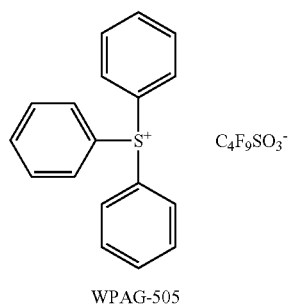
WPAG-505
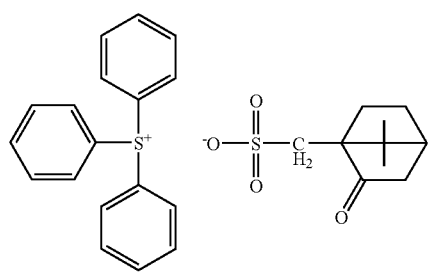
WPAG-567
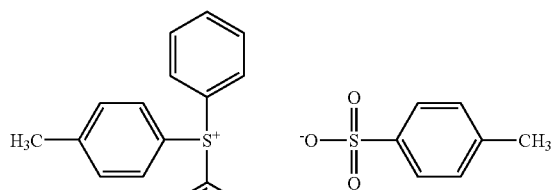
WPAG-350
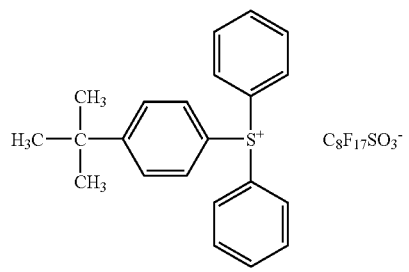
WPAG-360
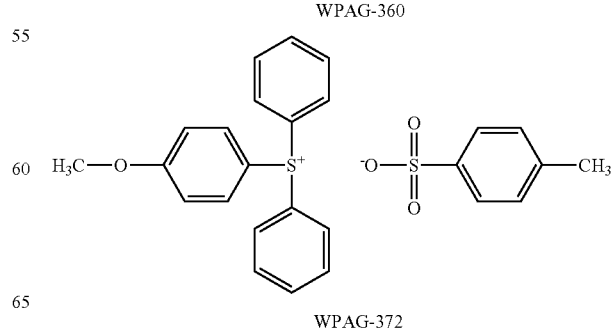
WPAG-372

-continued
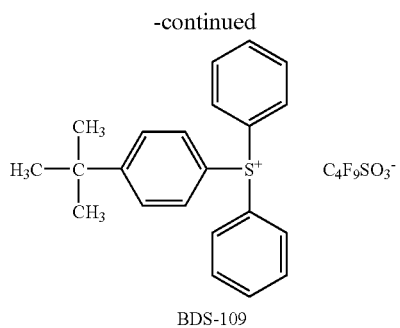
BDS-109
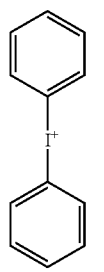
Diphenyliodonium Nitrate
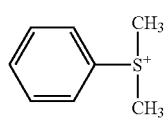 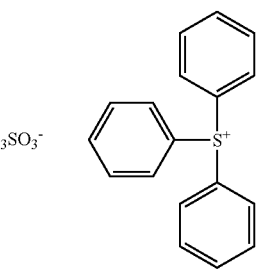
WPAG-315  WPAG-422
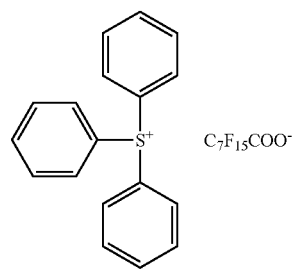
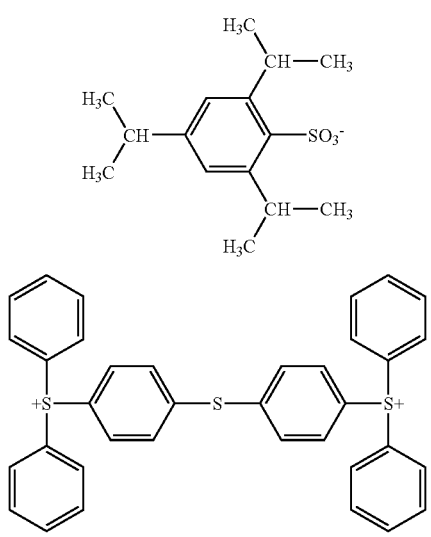
WPAG-419
-continued
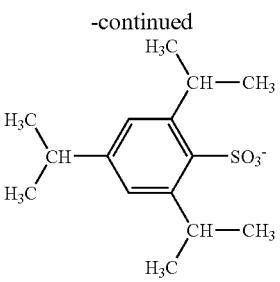
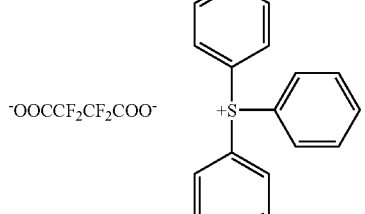
WPAG-461
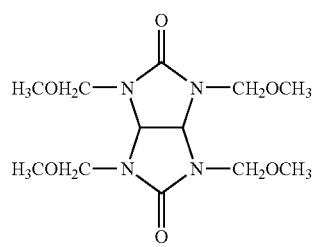
NIKALAC MX-270
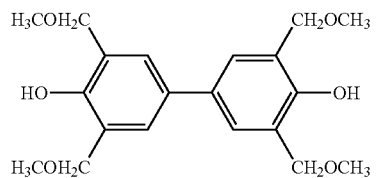
TMOM-BP
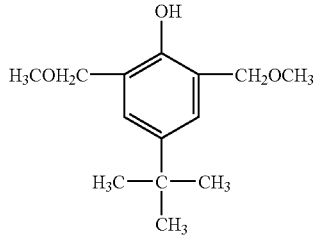
DMOM-PTBP
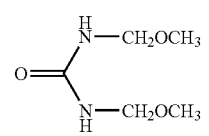
NIKALAC MX-290

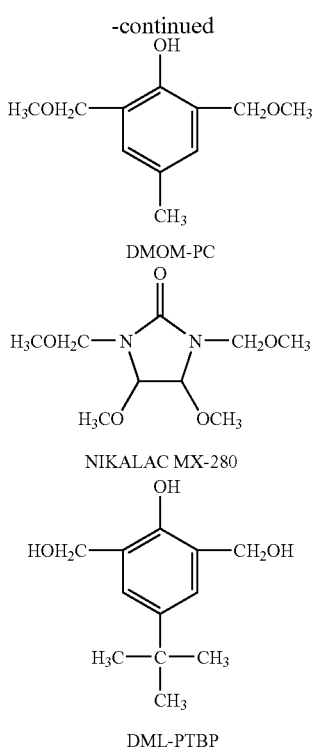

DMOM-PC

NIKALAC MX-280

DML-PTBP

Example 1

In 50 g of N-methyl-2-pyrrolidone (NMP) were dissolved 5.01 g (0.025 mol) of 4,4'-diaminophenyl ether and 1.24 g (0.005 mol) of 1,3-bis(3-aminopropyl)tetramethyldisiloxane in a dry nitrogen gas flow. To the solution were added 21.4 g (0.03 mol) of hydroxy group-containing acid anhydride (a) prepared in Synthesis 1 and 14 g of NMP, and the mixture was allowed to react at 20° C. for 1 hour and subsequently at 50° C. for 4 hours. Then, a solution of 7.14 g (0.06 mol) of N,N-dimethylformamide dimethylacetal in 5 g of NMP was dripped into the reaction mixture over a period of 10 minutes. After dripping, the mixture was stirred at 50° C. for 3 hours to yield a solution of Polymer A.

To 40 g of the polymer A solution were added 2 g of quinone diazide compound (e) prepared in Synthesis 5, 0.01 g of WPAG-314 (trade name, produced by Wako Pure Chemical Industries Ltd.), 1.2 g of NIKALAC MX-270 (trade name, produced by Sanwa Chemical Co., Ltd.) as a thermally cross-linkable compound, and 0.1 g of vinyltrimethoxysilane as an adhesion-enhancing agent to yield Varnish A being a photosensitive polyimide precursor composition. The resulting varnish was evaluated for workability of pattern formation, storage stability after exposure, and adhesion to the substrate, as described above.

Example 2

In 50 g of NMP was dissolved 15.1 g (0.025 mol) of hydroxy group-containing diamine (b) prepared in Synthesis 2 in a dry nitrogen gas flow. To the solution were added 17.5 g (0.025 mol) of hydroxy group-containing acid anhydride (a) prepared in Synthesis 1 and 30 g of pyridine, and the mixture was allowed to react at 60° C. for 6 hour. After the completion of the reaction, the solution was put into 2 L of water to produce precipitate, and the precipitate was collected by filtration. The precipitate was dried for 20 hours in a vacuum dryer of 80° C. to yield Polymer B.

In 30 g of GBL were dissolved 10 g of solid Polymer B, 2 g of quinone diazide compound (f) prepared in Synthesis 6, 0.1 g of WPAG-505 (trade name, produced by Wako Pure Chemical Industries Ltd.), 2 g of a thermally cross-linkable compound TMOM-BP (trade name, produced by Honshu Chemical Industry Co., Ltd.), 1.5 g of Bis-Z (trade name, produced by Honshu Chemical Industry Co., Ltd.), and 0.2 g of m-aminophenyltrimethoxysilane to yield Varnish B being a photosensitive polyimide precursor composition. The resulting varnish was evaluated for workability of pattern formation, storage stability after exposure, and adhesion to the substrate, as described above.

Example 3

In 50 g of NMP were dissolved 17 g (0.045 mol) of hydroxy group-containing diamine compound (c) prepared in Synthesis 3 and 1.24 g (0.005 mol) of 1,3-bis(3-aminopropyl)tetramethyldisiloxane in a dry nitrogen gas flow. To the solution were added 12.4 g (0.04 mol) of 3,3',4,4'-diphenylethertetracarboxylic anhydride (ODPA) and 21 g of NMP, and the mixture was allowed to react at 20° C. for 1 hour and subsequently at 50° C. for 2 hours. To the reaction mixture was added 0.98 g (0.01 mol), of maleic anhydride, and the mixture was stirred at 50° C. for 2 hours. Then, a solution of 14.7 g (0.1 mol) of N,N-dimethylformamide diethylacetal in 5 g of NMP was dripped into the mixture over a period of 10 minutes. After dripping, the mixture was stirred at 50° C. for 3 hours to yield a solution of Polymer C.

In 30 g of the polymer C solution were dissolved 1.6 g of quinone diazide compound (g) prepared in Synthesis 7, 0.05 g of WPAG-567 (trade name, produced by Wako Pure Chemical Industries Ltd.), 1 g of a thermally cross-linkable compound DMOM-PTBP (trade name, produced by Honshu Chemical Industry Co., Ltd.), and 0.5 g of p-aminophenyltrimethoxysilane to yield Varnish C being a photosensitive polyimide precursor composition. The resulting varnish was evaluated for workability of pattern formation, storage stability after exposure, and adhesion to the substrate, as described above.

Example 4

In 70 g of NMP were dissolved 6.08 g (0.025 mol) of hydroxy group-containing diamine compound (d) prepared in Synthesis 4, 4.51 g (0.0225 mol) of 4,4'-diaminodiphenyl ether, and 0.62 g (0.0025 mol) of 1,3-bis(3-aminopropyl)tetramethyldisiloxane in a dry nitrogen gas flow. To the solution were added 24.99 g (0.035 mol) of hydroxy group-containing acid anhydride (a), 4.41 g (0.015 mol) of 3,3',4,4'-biphenyltetracarboxylic dianhydride, and 25 g of NMP at room temperature. The mixture was stirred at room temperature for 1 hour, and subsequently at 50° C. for 2 hours. Then, a solution of 17.6 g (0.2 mol) of glycidyl methyl ether in 10 g of NMP was added to the reaction mixture and stirred at 70° C. for 6 hours to yield a solution of Polymer D.

In 40 g of the polymer D solution were dissolved 2.5 g of quinone diazide compound (h) prepared in Synthesis 8, 0.2 g of WPAG-350 (trade name, produced by Wako Pure Chemical Industries Ltd.), 1.5 g of a thermally cross-linkable compound NIKALAC MX-290 (trade name, produced by Sanwa Chemical Co., Ltd.), and 0.5 g of m-acetylaminophenyltrimethoxysilane to yield Varnish D being a photosensitive polyimide precursor composition. The resulting varnish was evaluated for workability of pattern formation, storage stability after exposure, and adhesion to the substrate, as described above.

Example 5

In 50 g of NMP were dissolved 13.6 g (0.018 mol) of hydroxy group-containing diamine compound (b) and 0.50 g (0.002 mol) of 1,3-bis(3-aminopropyl)tetramethyldisiloxane in a dry nitrogen gas flow. To the solution were added 17.86 g (0.025 mol) of hydroxy group-containing acid anhydride (a) and 30 g of pyridine, and the mixture was allowed to react 60° C. for 2 hour. Then, 0.59 g (0.005 mol) of 4-ethynylaniline was added as an end cap compound, and the reaction was further continued at 60° C. for another 2 hours. After the completion of the reaction, the solution was put into 2 L of water to precipitate solids, and the solids were collected by filtration. The solids were dried for 20 hours in a vacuum dryer of 80° C. to yield Polymer E.

In 30 g of GBL were dissolved 10 g of solid Polymer E, 2 g of quinone diazide compound (e), 0.01 g of WPAG-360 (trade name, produced by Wako Pure Chemical Industries Ltd.), 2 g of a thermally cross-linkable compound DMOM-PC (trade name, produced by Honshu Chemical Industry Co., Ltd.), 1.5 g of TPPA (trade name, produced by Honshu Chemical Industry Co., Ltd.), and 0.5 g of 3,3'-diaminodiphenyltetramethoxydisiloxane to yield Varnish E being a photosensitive polyimide precursor composition. The resulting varnish was evaluated for workability of pattern formation, storage stability after exposure, and adhesion to the substrate, as described above.

Example 6

Polymer F was prepared in the same manner as Example 5 except that 0.59 g of the end cap compound 4-ethynylaniline was replaced with 0.54 g (0.005 mol) of 3-aminophenol. In 30 g of GBL were dissolved 10 g of solid Polymer F, 2 g of quinone diazide compound (f), 0.005 g of WPAG-372 (trade name, produced by Wako Pure Chemical Industries Ltd.), 2 g of a thermally cross-linkable compound NIKALAC MX-280 (trade name, produced by Sanwa Chemical Co., Ltd.), 1.5 g of BIR-PC (trade name, produced by Honshu Chemical Industry Co., Ltd.), and 0.5 g of 3,3'-diacetylaminodiphenyltetramethoxydisiloxane to yield Varnish F being a photosensitive polyimide precursor composition. The resulting varnish was evaluated for workability of pattern formation, storage stability after exposure, and adhesion to the substrate, as described above.

Example 7

In 30 g of GBL were dissolved 10 g of solid Polymer B prepared in Example 2, 2 g of quinone diazide compound (g), 0.01 g of WPAG-314 (trade name, produced by Wako Pure Chemical Industries Ltd.), 0.5 g of a thermally cross-linkable compound NIKALAC MX-270, 1 g of DMOM-PC, 0.5 g of vinyltriethoxysilane, and 0.5 g of 3,3'-diacetylaminodiphenyltetramethoxydisiloxane to yield Varnish G being a photosensitive polyimide precursor composition. The resulting varnish was evaluated for workability of pattern formation, storage stability after exposure, and adhesion to the substrate, as described above.

Example 8

In 30 g of the Polymer C solution were dissolved 1.6 g of quinone diazide compound (g), 0.01 g of BDS-109 (trade name, produced by Midori Kagaku Co., Ltd.), 0.01 g of WPAG-567 (trade name, produced by Wako Pure Chemical Industries Ltd.), 1 g of a thermally cross-linkable compound DMOM-PTBP (trade name, produced by Honshu Chemical Industry Co., Ltd.), and 0.5 g of m-acetylaminophenyltrimethoxysilane to yield Varnish H being a photosensitive polyimide precursor composition. The resulting varnish was evaluated for workability of pattern formation, storage stability after exposure, and adhesion to the substrate, as described above.

Example 9

In 50 g of NMP and 26.4 g (0.3 mol) of glycidyl methyl ether was dissolved 18.3 g (0.05 mol) of BAHF in a dry nitrogen gas flow, and the solution was cooled to −15° C. A solution of 14.7 g (0.050 mol) of diphenyletherdicarbonyl dichloride in 25 g of GBL was dripped into the foregoing solution such as not to increase the temperature of the mixture to more than 0° C. After the completion of dripping, the mixture was stirred at −15° C. for 6 hours to react. After the completion of reaction, the solution was put into 3 L of water to produce a white precipitate. The precipitate was collected by filtration, washed with water three times, and dried in a vacuum dryer of 80° C. for 20 hours to yield Polymer G.

In 30 g of GBL were dissolved 10 g of solid Polymer G, 2 g of quinone diazide compound (f), 0.01 g of WPAG-314 (trade name, produced by Wako Pure Chemical Industries Ltd.), 1 g of a thermally cross-linkable compound DMOM-PC (trade name, produced by Honshu Chemical Industry Co., Ltd.), and 0.5 g of p-aminophenyltrimethoxysilane to yield Varnish I being a photosensitive polybenzoxazole precursor composition. The resulting varnish was evaluated for workability of pattern formation, storage stability after exposure, and adhesion to the substrate, as described above.

Comparative Example 1

Varnish J being a photosensitive polyimide precursor composition was prepared in the same manner as Example 1 except that WPAG-314 and vinyltrimethoxysilane were not used. The resulting varnish was evaluated for workability of pattern formation, storage stability after exposure, and adhesion to the substrate, as described above.

Comparative Example 2

Varnish K being a photosensitive polyimide precursor composition was prepared in the same manner as Example 2 except that WPAG-505 and m-aminophenyltrimethoxysilane were not used. The resulting varnish was evaluated for workability of pattern formation, storage stability after exposure, and adhesion to the substrate, as described above.

Comparative Example 3

Varnish L being a photosensitive polyimide precursor composition was prepared in the same manner as Example 3 except that WPAG-567 was not used and the thermally cross-linkable compound DMOM-PTBP was replaced with DML-PTBP (trade name, produced by Honshu Chemical Co., Ltd.). The resulting varnish was evaluated for workability of pattern formation, storage stability after exposure, and adhesion to the substrate, as described above.

Comparative Example 4

Blended were 24.82 g (0.08 mol) of 3,3',4,4'-diphenylethertetracarboxylic dianhydride, 11.86 g (0.16 mol) of n-butyl alcohol, 0.4 g (0.004 mol) of triethylamine, and 110 g of NMP in a dry nitride gas flow. The mixture was stirred to react at room temperature for 8 hours to yield a solution of di-n-butyl 3,3',4,4'-diphenylethertetracarboxylate in NMP.

After cooling the solution to 0° C., 17.13 g (0.144 mol) of thionyl chloride was dripped into the solution and allowed to react for 1 hour to yield a solution of di-n-butyl 3,3',4,4'-diphenylethertetracarboxylate ester dichloride. Then, a 0.5 L flask equipped with a stirrer and a thermometer was charged with 105 µg of NMP, and 26.37 g (0.072 mol) of BAHF was added into the flask. The mixture was stirred to dissolve the agents, and 22.78 g (0.288 mol) of pyridine was added. Then, the di-n-butyl 3,3',4,4'-diphenylethertetracarboxylate ester dichloride solution was dripped into the flask over a period of 20 minutes, with temperature maintained between 0 and 5° C. Then, the mixture was stirred at 30° C. for 1 hour. The resulting solution was put into 3 L of water to precipitate solids. After being collected and washed, the solids were dried in a vacuum dryer of 80° C. for 20 hours to yield Polymer H.

In 30 g of NMP were dissolved 10 g of solid Polymer H, 2 g of quinone diazide compound (g), 0.1 g of diphenyliodonium nitrate, and 1 g of a bisphenol A type epoxy resin EPIKOTE 828 (trade name, produced by Japan Epoxy Resins Co., Ltd.) to yield Varnish M being a photosensitive polyimide precursor composition. The resulting varnish was evaluated for workability of pattern formation, storage stability after exposure, and adhesion to the substrate, as described above.

Comparative Example 5

In 30 g of NMP were dissolved 10 g of solid Polymer H prepared in Comparative Example 4, 2 g of quinone diazide compound (h), 0.10 g of diphenyliodonium nitrate, and 0.50 g of dimethylol urea to yield Varnish N being a photosensitive polyimide precursor composition. The resulting varnish was evaluated for workability of pattern formation, storage stability after exposure, and adhesion to the substrate, as described above.

Comparative Example 6

Varnish O being a photosensitive polyimide precursor composition was prepared in the same manner as Comparative Example 5 except that dimethylol urea was replaced with 1,4-bis(methoxyphenoxy)benzene. The resulting varnish was evaluated for workability of pattern formation, storage stability after exposure, and adhesion to the substrate, as described above.

Comparative Example 7

Varnish P being a photosensitive polyimide precursor composition was prepared in the same manner as Comparative Example 4 except that EPIKOTE 828 was not used. The resulting varnish was evaluated for workability of pattern formation, storage stability after exposure, and adhesion to the substrate, as described above.

Comparative Example 8

Blended were 32.2 g (0.1 mol) of benzophenonetetracarboxylic dianhydride, 200 g of NMP, and 26.06 g (0.21 mol) of p-hydroxybenzyl alcohol, and the mixture was stirred. Subsequently 21.2 g (0.21 mol) of triethylamine was dripped into the mixture over a period of 30 minutes. The mixture was allowed to stand for 3 hours to react. After the completion of reaction, 20.02 g (0.1 mol) of 4,4'-diaminodiphenyl ether was added, and the mixture was stirred to dissolve the agents for 30 minutes. Then, 0.21 mol of diphenyl(2,3-dihydro-2-thioxo-3-benzoxazole)phosphonate was added at 5 times, and the mixture was allowed to stand for 5 hours to promote a condensation reaction. The resulting slurry mixture was put into a large amount of methanol to wash. The product was dried in a vacuum dryer of 80° C. for 20 hours to yield Polymer I, whose p and q in formula (1) have the relationship p+q=0.

In 30 g of NMP were dissolved 10 g of solid Polymer I, 2 g of quinone diazide compound (g), 5 g of triethyleneglycol divinyl ether to yield Varnish Q being a photosensitive polyimide precursor composition. The resulting varnish was evaluated for workability of pattern formation, storage stability after exposure, and adhesion to the substrate, as described above.

Comparative Example 9

Blended were 3.44 g (0.0117 mol) of 1,4-bis(4-aminophenoxy)benzene, 9.42 g (0.047 mol) of 4,4'-diaminodiphenyl ether, and 140 g of NMP, and the mixture was gradually stirred to dissolve the agents completely. Then, 1.24 g (0.0056 mol) of pyromellitic dianhydride and 15.92 g (0.0513 mol) of ODPA were gradually added to the solution and stirred at room temperature. After stirring for 2 hours, 0.49 g (0.0029 mol) of 5-norbornene-2,3-dicarboxylic anhydride was gradually added, and the mixture was stirred at room temperature for 16 hours. Then, 50 g of NMP was added to the resulting solution to dilute it with the temperature maintained at −25° C. The solution was stirred at room temperature while a solution of 7.26 g (0.0717 mol) of triethylamine in 30 g of NMP was gradually added. A solution of 7.18 g (0.0759 mol) of chloromethyl ethyl ether in 30 g of NMP was further added gradually. After stirring for 2 hours, triethylammonium chloride was removed by filtration with the temperature maintained low. The filtrate was gradually added to a mixture of 1 L of methanol and 2 L of distilled water to precipitate white fine-grain solids. The product was washed with about 5 L of distilled water and dried in a vacuum dryer of 80° C. for 20 hours to yield Polymer J, whose p and q in formula (1) have the relationship p+q=0.

In 30 g of NMP were dissolved 10 g of solid Polymer J, 2 g of quinone diazide compound (h) and 0.01 g of WPAG-314 (trade name, produced by Wako Pure Chemical Industries Ltd.) to yield Varnish R being a photosensitive polyimide precursor composition. The resulting varnish was evaluated for workability of pattern formation, storage stability after exposure, and adhesion to the substrate, as described above.

Comparative Example 10

A solution of Polymer K, whose p and q in formula (1) have the relationship p+q=0, was prepared in the same manner as Example 1 except that hydroxy group-containing acid anhydride (a) used for Polymer A was replaced with ODPA. Then, Varnish S being a photosensitive polyimide composition was prepared in the same manner as Example 3 except that the resulting polymer K solution was used instead of Polymer C solution. The resulting varnish was evaluated for workability of pattern formation, storage stability after exposure, and adhesion to the substrate, as described above.

Example 10

Varnish T being a photosensitive polyimide precursor composition was prepared in the same manner as Example 1 except that the thermally cross-linkable compound NIKALAC MX-270 was replaced with a thermally cross-linkable compound DMOM-PTBT and the adhesion-enhancing agent vinyltrimethoxysilane was not used. The resulting varnish was evaluated for workability of pattern formation, storage stability after exposure, and adhesion to the substrate, as described above.

Example 11

Varnish U being a photosensitive polyimide precursor composition was prepared in the same manner as Example 2 except that WPAG-505 and the thermally cross-linkable compound TMOM-BP were replaced with WPAG-567 and a thermally cross-linkable compound DMOM-PC and the adhesion-enhancing agent m-aminophenyltrimethoxysilane was not used. The resulting varnish was evaluated for workability of pattern formation, storage stability after exposure, and adhesion to the substrate, as described above.

Example 12

Varnish V being a photosensitive polyimide precursor composition was prepared in the same manner as Example 1 except that WPAG-314 was replaced with WPAG-315. The resulting varnish was evaluated for workability of pattern formation, storage stability after exposure, and adhesion to the substrate, as described above.

Example 13

Varnish W being a photosensitive polyimide precursor composition was prepared in the same manner as Example 2 except that WPAG-505 and the thermally cross-linkable compound TMOM-BP were replaced with WPAG-419 and the thermally cross-linkable compound NIKALAC MX-280. The resulting varnish was evaluated for workability of pattern formation, storage stability after exposure, and adhesion to the substrate, as described above.

Example 14

Varnish X being a photosensitive polyimide precursor composition was prepared in the same manner as Example 4 except that WPAG-350 was replaced with WPAG-461. The resulting varnish was evaluated for workability of pattern formation, storage stability after exposure, and adhesion to the substrate, as described above.

Example 15

Varnish Y being a photosensitive polybenzoxazole precursor composition was prepared in the same manner as Example 9 except that WPAG-314 was replaced with WPAG-422. The resulting varnish was evaluated for workability of pattern formation, storage stability after exposure, and adhesion to the substrate, as described above.

The constituents of the varnishes of Examples 1 to 15 and Comparative Examples 1 to 10 are shown in Table 1, and the evaluation results are shown in Table 2.

TABLE 1

| | Varnish | Polymer | Photo acid generator | | Constituent (c) | Constituent (d) | Solubility adjuster |
|---|---|---|---|---|---|---|---|
| Example 1 | A | A | Quinone diazide (e) | WPAG-314 | NIKALAC MX-270 | Vinyltrimethoxysilane | None |
| Example 2 | B | B | Quinone diazide (f) | WPAG-505 | TMOM-BP | m-Aminophenyltrimethoxysilane | Bis-Z |
| Example 3 | C | C | Quinone diazide (g) | WPAG-567 | DMOM-PTBP | p-Aminophenyltrimethoxysilane | None |
| Example 4 | D | D | Quinone diazide (h) | WPAG-350 | NIKALAC MX-290 | m-Acetylaminophenyl-trimethoxysilane | None |
| Example 5 | E | E | Quinone diazide (e) | WPAG-360 | DMOM-PC | 3,3'-diaminodiphenyltetra-methoxydisiloxane | TPPA |
| Example 6 | F | F | Quinone diazide (f) | WPAG-372 | NIKALAC MX-280 | 3,3'-Diacetylaminodiphenyltetra-methoxydisiloxane | BIR-PC |

TABLE 1-continued

|  | Varnish | Polymer | Photo acid generator |  | Constituent (c) | Constituent (d) | Solubility adjuster |
|---|---|---|---|---|---|---|---|
| Example 7 | G | B | Quinone diazide (g) | WPAG-314 | NIKALAC MX-270 DMOM-PC | Vinyltriethoxysilane, 3,3'-Diacetylaminodiphenyltetramethoxydisiloxane | None |
| Example 8 | H | C | Quinone diazide (g) | BDS-109 WPAG-567 | DMOM-PTBP | m-Acetylaminophenyltrimethoxysilane | None |
| Example 9 | I | G | Quinone diazide (f) | WPAG-314 | DMOM-PC | p-Aminophenyltrimethoxysilane | None |
| Comparative Example 1 | J | A | Quinone diazide (e) |  | NIKALAC MX-270 | None | None |
| Comparative Example 2 | K | B | Quinone diazide (f) |  | TMOM-BP | None | Bis-Z |
| Comparative Example 3 | L | C | Quinone diazide (g) |  | DML-PTBP | p-Aminophenyltrimethoxysilane | None |
| Comparative Example 4 | M | H | Quinone diazide (g) | Diphenyliodonium nitrate | EPIKOTE 828 | None | None |
| Comparative Example 5 | N | H | Quinone diazide (h) | Diphenyliodonium nitrate | Dimethylol urea | None | None |
| Comparative Example 6 | O | H | Quinone diazide (h) | Diphenyliodonium nitrate | 1,4-Bis-(methoxyphenoxy)benzene | None | None |
| Comparative Example 7 | P | H | Quinone diazide (g) | Diphenyliodonium nitrate | None | None | None |
| Comparative Example 8 | Q | I | Quinone diazide (g) |  | Triethyleneglycol divinyl ether | None | None |
| Comparative Example 9 | R | J | Quinone diazide (h) | WPAG-314 | None | None | None |
| Comparative Example 10 | S | K | Quinone diazide (g) | WPAG-567 | DMOM-PTBP | p-Aminophenyltrimethoxysilane | None |
| Example 10 | T | A | Quinone diazide (e) | WPAG-314 | NIKALAC MX-270 | None | None |
| Example 11 | U | B | Quinone diazide (f) | WPAG-567 | DMOM-PC | None | None |
| Example 12 | V | A | Quinone diazide (e) | WPAG-315 | NIKALAC MX-270 | Vinyltrimethoxysilane | None |
| Example 13 | W | B | Quinone diazide (f) | WPAG-419 | NIKALAC MX-280 | m-Aminophenyltrimethoxysilane | Bis-Z |
| Example 14 | X | D | Quinone diazide (h) | WPAG-461 | NIKALAC MX-290 | m-Acetylaminophenyltrimethoxysilane | None |
| Example 15 | Y | G | Quinone diazide (f) | WPAG-422 | DMOM-PC | p-Aminophenyltrimethoxysilane | None |

TABLE 2

|  |  | Workability of pattern formation | | | Storage stability after exposure (after 48-h exposure) | | Adhesion to substrate | |
|---|---|---|---|---|---|---|---|---|
|  | Varnish | Photosensitivity (ms) | Resolution (μm) | Shrinkage (%) | Photosensitivity (ms) | Resolution (μm) | After 0-h PCT | After 100-h PCT |
| Example 1 | A | 550 | 5 | 23 | 550 | 6 | 0 | 0 |
| Example 2 | B | 500 | 5 | 24 | 500 | 5 | 0 | 0 |
| Example 3 | C | 450 | 4 | 24 | 500 | 4 | 0 | 0 |
| Example 4 | D | 400 | 4 | 23 | 450 | 4 | 0 | 0 |
| Example 5 | E | 550 | 3 | 22 | 550 | 3 | 0 | 0 |
| Example 6 | F | 500 | 3 | 24 | 550 | 4 | 0 | 0 |
| Example 7 | G | 400 | 5 | 21 | 450 | 5 | 0 | 0 |
| Example 8 | H | 400 | 5 | 23 | 450 | 5 | 0 | 0 |
| Example 9 | I | 600 | 5 | 23 | 650 | 5 | 0 | 6 |
| Comparative Example 1 | J | 900 | 10 | 27 | 1300 | 20 | 0 | 63 |
| Comparative Example 2 | K | 950 | 10 | 25 | 1400 | 20 | 0 | 92 |
| Comparative Example 3 | L | 850 | 10 | 24 | 2000 | 20 | 0 | 10 |
| Comparative Example 4 | M | 650 | 5 | 27 | 2000 | 15 | 0 | 30 |
| Comparative Example 5 | N | 700 | 5 | 26 | 1700 | 15 | 0 | 46 |
| Comparative Example 6 | O | 750 | 5 | 26 | 1300 | 10 | 0 | 100 |
| Comparative Example 7 | P | 650 | 5 | 32 | 1300 | 15 | 0 | 32 |
| Comparative Example 8 | Q |  | Not patterned |  |  | Not patterned | 0 | 66 |
| Comparative Example 9 | R |  | Not patterned |  |  | Not patterned | 0 | 88 |
| Comparative Example 10 | S |  | Not patterned |  |  | Not patterned | 0 | 4 |

TABLE 2-continued

| | Varnish | Workability of pattern formation | | | Storage stability after exposure (after 48-h exposure) | | Adhesion to substrate | |
| | | Photosensitivity (ms) | Resolution (μm) | Shrinkage (%) | Photosensitivity (ms) | Resolution (μm) | After 0-h PCT | After 100-h PCT |
|---|---|---|---|---|---|---|---|---|
| Example 10 | T | 550 | 5 | 24 | 550 | 5 | 0 | 10 |
| Example 11 | U | 500 | 5 | 22 | 500 | 5 | 0 | 14 |
| Example 12 | V | 550 | 5 | 24 | 600 | 5 | 0 | 0 |
| Example 13 | W | 550 | 5 | 23 | 600 | 5 | 0 | 0 |
| Example 14 | X | 550 | 5 | 25 | 600 | 5 | 0 | 0 |
| Example 15 | Y | 600 | 5 | 25 | 650 | 6 | 0 | 4 |

What is claimed is:

1. A photosensitive resin precursor composition comprising:
(a) a polymer comprising a structural unit expressed by formula (1):

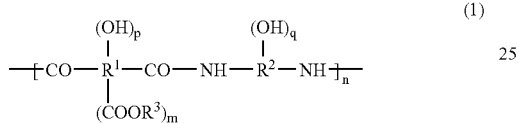

wherein $R^1$ represents an organic group with a valence of 2 to 8, having at least two carbon atoms; $R^2$ represents an organic group with a valence of 2 to 6, having at least two carbon atoms; $R^3$ represents one selected from the group consisting of hydrogen and organic groups having a carbon number in the range of 1 to 20; n represents a number of ranging from 10 to 100,000; m represents 1 or 2; and p and q are each an integer in the range of 0 to 4 and satisfy the relationship p+q>0;
(b) at least two photo acid generators wherein at least one of said at least two photo acid generators is a quinone diazide compound, and at least one of said at least two photo acid generators is selected from the group consisting of sulfonium salts, phosphonium salts, and diazonium salts; and
(c) a compound having an alkoxymethyl group; and
(d) a compound expressed by formulas (3) or (4):

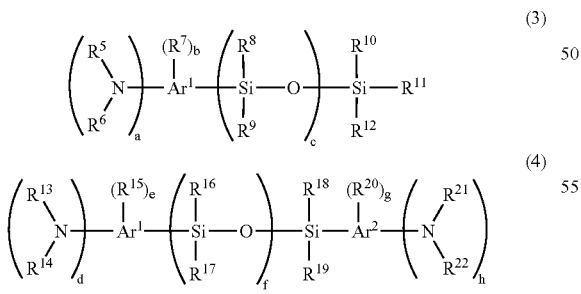

wherein $Ar^1$ and $Ar^2$ are each selected from the group consisting of aromatic rings having at least 6 carbon atoms and aromatic heterocyclic structures having at least 2 carbon atoms; $R^5$, $R^6$, $R^{13}$, $R^{14}$, $R^{21}$, and $R^{22}$ may be the same or different, and are each selected from the group consisting of hydrogen and organic groups having a carbon number in the range of 1 to 4; $R^7$, $R^{15}$, and $R^{20}$ may be the same or different, and each represent an organic group having a carbon number in the range of 1 to 6; $R^8$ to $R^{12}$ and $R^{16}$ to $R^{19}$ may be the same or different, and are each selected from the group consisting of hydrocarbon groups having a carbon number in the range of 1 to 6, alkoxy groups having a carbon number in the range of 1 to 6, and the phenyl group, and at least one of $R^8$ to $R^{12}$ and $R^{16}$ to $R^{19}$ is one of the alkoxy groups; a, d, f, and h are each a natural number; and b, c, e, and g are each an integer of 0 or more and satisfy the relationships $1 \leq a+b \leq 4$, $1 \leq d+e \leq 4$, and $1 \leq g+h \leq 4$,
wherein the photosensitive resin precursor composition is a positive photosensitive resin precursor composition,
further wherein the compound expressed by formulas (3) or (4) is mixed in the polymer comprising the structural unit expressed by formula (1) to form an integral mix of the compound expressed by formulas (3) or (4) and the polymer comprising the structural unit expressed by formula (1).

2. The photosensitive resin precursor composition according to claim 1, wherein at least one of said at least two photo acid generators is a quinone diazide compound, and at least one of said at least two photo acid generators is selected from sulfonium salts expressed by formulas (14) to (16):

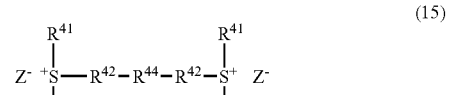

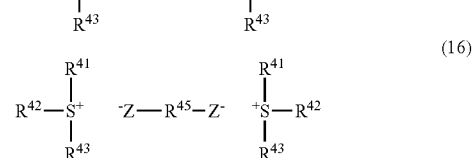

wherein $R^{41}$ and $R^{42}$ may be the same or different, and each represent an organic group having a carbon number in the range of 1 to 20; $R^{44}$ and $R^{45}$ each represent one selected from the group consisting of a single bond and organic groups having a carbon number in the range of 1 to 20; $Z^-$ represents an anion portion selected from the group consisting of $R^{46}SO_3^-$, $R^{46}COO^-$, and $SbF_6^-$; and $R^{46}$ represents an organic group having a carbon number in the range of 1 to 20.

3. The photosensitive resin precursor composition according to claim 1, wherein at least one of said at least two photo acid generators is a quinone diazide compound, and at least one of said at least two photo acid generators is a triarylsulfonium salt.

4. The photosensitive resin precursor composition according to claims 1, 2 and 3, wherein (c) the compound having an alkoxymethyl group contains at least one of a compound having a phenolic hydroxy group and/or a compound having a ureal organic group expressed by formula (2):

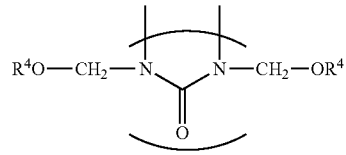

(2)

wherein $R^4$ represents an alkyl group having a carbon number in the range of 1 to 20.

* * * * *